(12) United States Patent
Ishida

(10) Patent No.: US 8,193,552 B2
(45) Date of Patent: Jun. 5, 2012

(54) SEMICONDUCTOR LIGHT EMITTING DEVICE OF JUNCTION-DOWN TYPE AND SEMICONDUCTOR LIGHT EMITTING ELEMENT OF JUNCTION-DOWN TYPE

(75) Inventor: Yuji Ishida, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 333 days.

(21) Appl. No.: 12/320,841

(22) Filed: Feb. 5, 2009

(65) Prior Publication Data
US 2009/0200571 A1 Aug. 13, 2009

(30) Foreign Application Priority Data

Feb. 7, 2008 (JP) ................................ P2008-028126
Sep. 3, 2008 (JP) ................................ P2008-225988

(51) Int. Cl.
*H01L 33/00* (2010.01)
(52) U.S. Cl. ............ 257/99; 257/E33.057; 257/E33.066
(58) Field of Classification Search .................... 257/99, 257/E33.057, E33.058, E33.062, E33.066; 372/46.01, 50.1, 50.11, 50.124, 87
See application file for complete search history.

(56) References Cited

U.S. PATENT DOCUMENTS

| 6,985,505 B2 * | 1/2006 | Nomoto et al. | 372/49.01 |
| 2004/0161010 A1 * | 8/2004 | Matsumura | 372/46 |
| 2009/0097523 A1 * | 4/2009 | Bessho et al. | 372/50.121 |

FOREIGN PATENT DOCUMENTS

| JP | 63-276287 A | 11/1988 |
| JP | 64-061085 | 3/1989 |
| JP | 2001-358404 | 12/2001 |

OTHER PUBLICATIONS

Foreign Office Action issued on Mar. 27, 2012.
English translation of foreign Office Action issued on Mar. 27, 2012.

* cited by examiner

*Primary Examiner* — Minh-Loan T Tran
(74) *Attorney, Agent, or Firm* — Rabin & Berdo, P.C.

(57) ABSTRACT

In a semiconductor light emitting device of junction-down type, a semiconductor light emitting element having a stripe part is provided with a bonding part for die bonding in a part of a surface thereof where the stripe part is formed, the bonding part being at a position away from the stripe part, and being junction-down bonded onto an electrode pattern on a holding substrate.

15 Claims, 23 Drawing Sheets

SEMICONDUCTOR LIGHT EMITTING DEVICE OF JUNCTION-DOWN TYPE AND SEMICONDUCTOR LIGHT EMITTING ELEMENT OF JUNCTION-DOWN TYPE

CROSS REFERENCE TO RELATED APPLICATIONS AND INCORPORATION BY REFERENCE

This application is based upon and claims the benefit of priority from prior Japanese Patent Application P2008-28126 filed on Feb. 7, 2008 and prior Japanese Patent Application P2008-225988 Sep. 3, 2008; the entire contents of which are incorporated by reference herein.

TECHNICAL FIELD

The present invention relates to a semiconductor light emitting device and a semiconductor light emitting element of junction-down type, including a semiconductor laminate portion having a stripe part formed therein.

BACKGROUND ART

There has heretofore been known a semiconductor light emitting element, such as a semiconductor laser element having a semiconductor laminate portion in which a stripe part is formed, and a semiconductor light emitting device including the semiconductor light emitting element (see Patent Literature 1). Patent Literature 1 discloses a semiconductor laser element having a stripe part for carrier injection, the stripe part being made of a semiconductor and including an optical guide layer and a cladding layer. In an uppermost layer of the stripe part, a p-side electrode is provided. This p-side electrode is electrically connected to a bonding wire through an extraction electrode. As a type of such a semiconductor light emitting element, there is a junction-down type having a stripe part side connected to a submount.

A semiconductor light emitting element 100 of junction-down type shown in FIGS. 1 and 2 includes a substrate 101, a semiconductor laminate portion 102, an insulating film 103, a wire-bonded n-side electrode 104 and a bonding pad 105 die-bonded to a submount. The semiconductor laminate portion 102 is formed on the substrate 101 and has a stripe part 106 for allowing a current to flow only narrowly. The insulating film 103 is formed on the semiconductor laminate portion 102 and has an opening 103a so as to expose the stripe part 106. The n-side electrode 104 is formed so as to cover a back surface of the substrate 101. The bonding pad 105 also functions as a p-side electrode electrically connected to the stripe part 106. The bonding pad 105 is formed so as to cover the entire area of a surface of the insulating film 103.

In the semiconductor light emitting element 100 described above, when a voltage is applied between the n-side electrode 104 and the bonding pad 105, a current flows only in a lamination direction in the stripe part 106 and in the vicinity thereof. This causes the semiconductor laminate portion 102 to turn into a population inversion state, thereby causing stimulated emission. Consequently, light is emitted.

CITATION LIST

Patent Literature 1. Japanese Patent Application Publication No. 2001-358404

SUMMARY OF INVENTION

Technical Problem

However, in the semiconductor light emitting element 100 of junction-down type described above, the bonding pad 105 is formed so as to cover the entire surface of the insulating film 103.

When the semiconductor light emitting element 100 is die-bonded to the substrate, stress may be generated by a difference in linear expansion coefficient or the like between the bonding pad 105 and a solder material layer in contact with the bonding pad. When this stress generated on the entire surface is transmitted to the stripe part 106, deterioration of the semiconductor light emitting element 100 may be advanced.

The present invention provides a semiconductor light emitting element and a semiconductor light emitting device of junction-down type which enable suppression of stress generated in bonding and transmitted to a stripe part.

Solution to Problem

In a semiconductor light emitting device of the present invention, a semiconductor light emitting element having a stripe part is provided with a bonding part for die bonding in a part of a surface thereof where the stripe part is formed, the bonding part being at a position away from the stripe part, and being junction-down bonded onto an electrode pattern on a holding substrate.

A semiconductor light emitting element of the present invention includes: a substrate; a semiconductor laminate portion which is formed on the substrate and has a stripe part formed therein; an insulating film formed on the semiconductor laminate portion so as to expose the stripe part; and a bonding pad having an electrode unit electrically connected to the stripe part exposed from the insulating film and a bonding part formed on the insulating film in a state of being electrically insulated from the electrode unit. In the above configuration, a pair of the bonding parts may be provided so as to sandwich the electrode unit therebetween. In the above configuration, the electrode unit and the bonding parts may be made of the same material. In the above configuration, the insulating film may be exposed between the electrode unit and the bonding parts.

A semiconductor light emitting device of the present invention includes: a semiconductor light emitting element including a substrate, a semiconductor laminate portion which is formed on the substrate and has a stripe part formed therein, an insulating film formed on the semiconductor laminate portion so as to expose the stripe part, and a first bonding pad having a first electrode unit electrically connected to the stripe part exposed from the insulating film and a first bonding part formed on the insulating film in a state of being electrically insulated from the electrode unit; and a submount including a holding substrate, and a second bonding pad formed on the holding substrate, the second bonding pad having a second electrode unit electrically connected to the first electrode unit in the semiconductor light emitting element, and a second bonding part electrically insulated from the second electrode unit and bonded to the first bonding part in the semiconductor light emitting element.

In the above configuration, a surface of the first bonding pad may contain Au, a surface of the second bonding pad may contain Au, and the first and second bonding pads may be bonded by a solder material containing Sn.

A semiconductor light emitting device of the present invention includes: a submount including a holding substrate and an electrode pattern formed on the holding substrate; a solder material layer formed on at least a part of the electrode pattern; and a semiconductor light emitting element having a semiconductor laminate portion including semiconductor layers laminated therein and including a convex stripe part formed on the holding substrate side and a stripe protection part connected to the solder material layer, the stripe protection part having an upper surface higher than an upper surface of the stripe part.

In the above configuration, the solder material layer does not have to be formed directly on the stripe part. In the above configuration, a stress buffer film may be formed on the stripe part. In the above configuration, the stress buffer film may be made of a material repelling the solder material layer. In the above configuration, the stress buffer film may be made of an elastic member. In the above configuration, the electrode pattern may be formed at a position facing the stripe protection part. In the above configuration, the electrode pattern may include a pad part formed in a part on the submount and connected to the outside.

Advantageous Effects of Invention

The present invention can provide a semiconductor light emitting element and a semiconductor light emitting device of junction-down type which enable suppression of stress generated in bonding and transmitted to a stripe part.

DESCRIPTION OF EMBODIMENTS

Embodiments

First Embodiment

With reference to the drawings, description will be given below of a first embodiment in which the present invention is applied to a semiconductor laser element and a semiconductor laser device of junction-down type. Note that the semiconductor laser device according to the first embodiment can be applied to an optical disk device, a laser printer, an optical communication device and the like.

Figure 3:
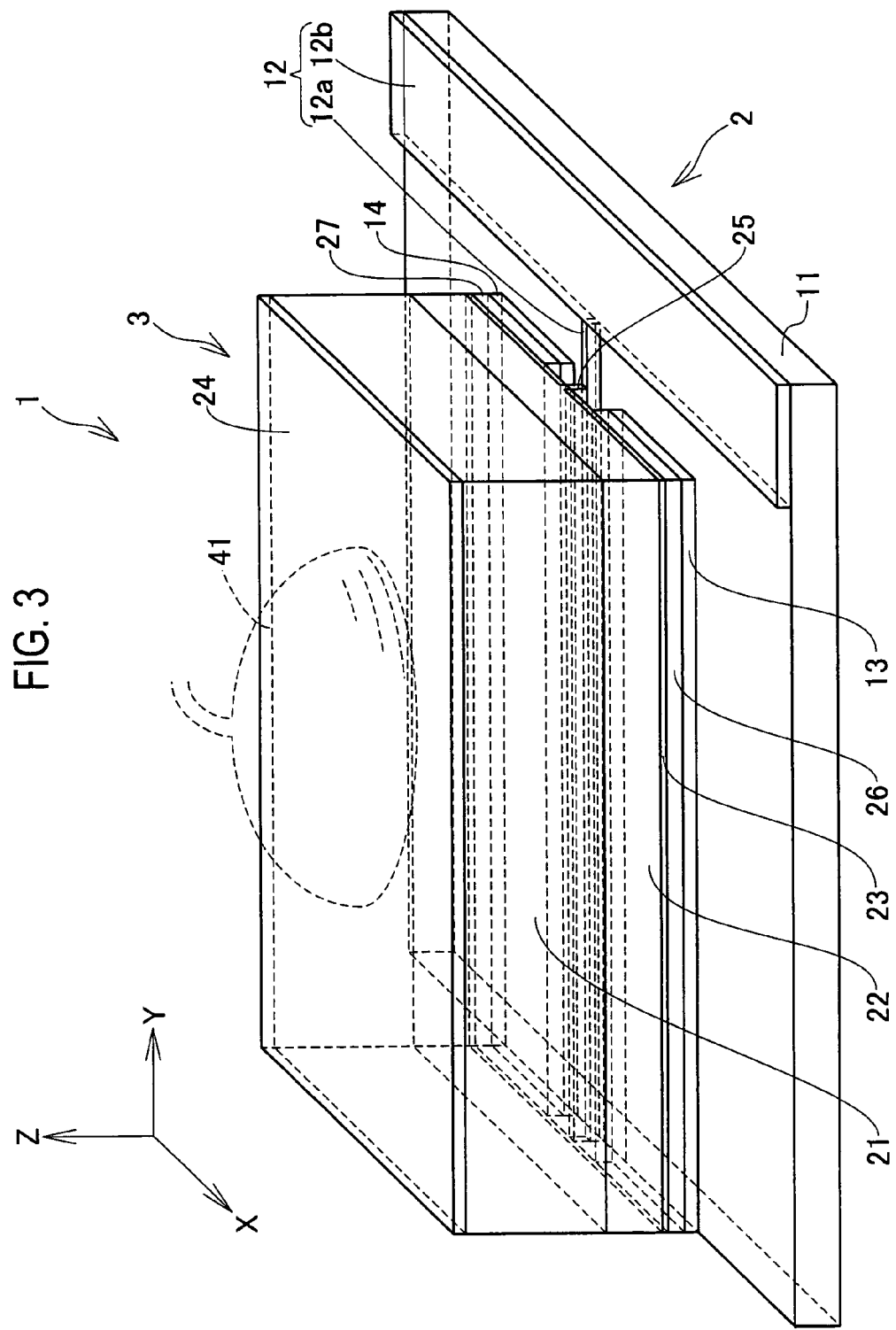
FIG. 3 is an overall perspective view of a semiconductor laser device according to a first embodiment.
Figure 4:
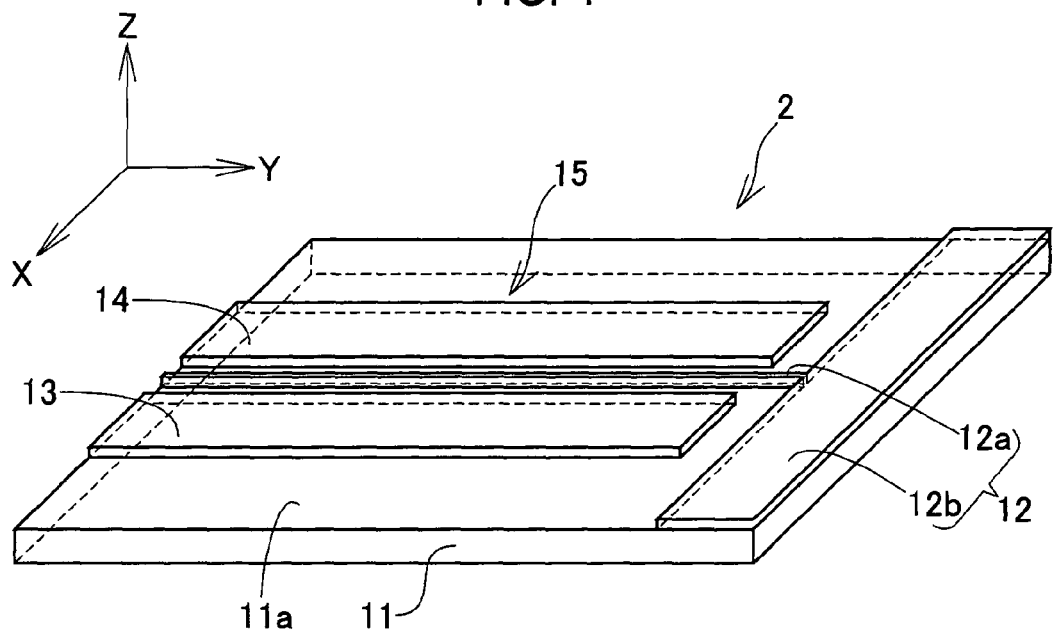
FIG. 4 is a perspective view of a submount.
Figure 5:
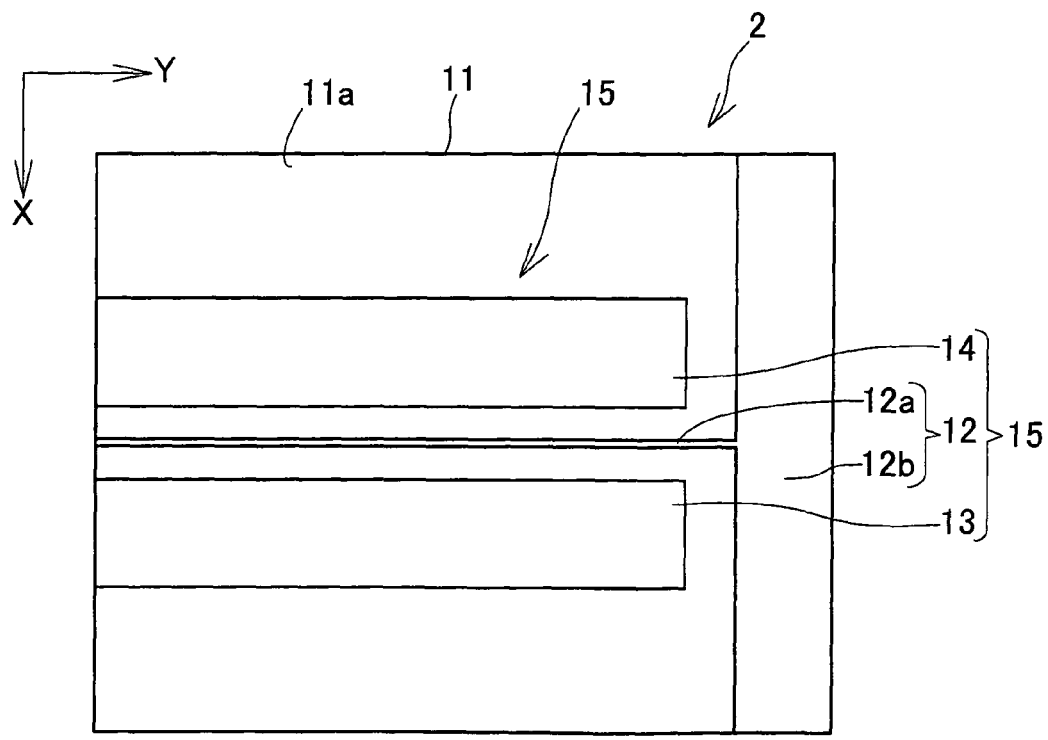
FIG. 5 is a plan view of the submount.
Figure 6:
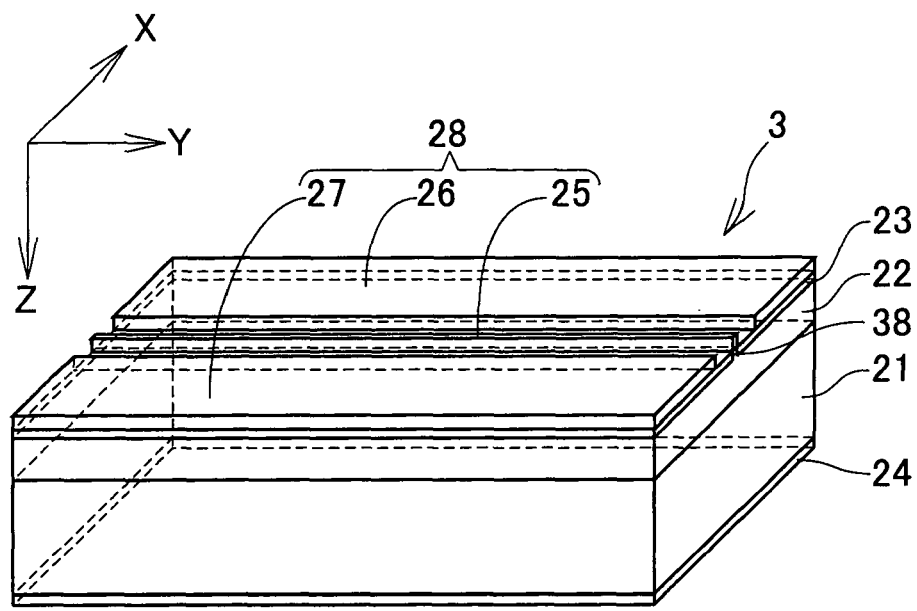
FIG. 6 is a perspective view of a semiconductor laser element.
Figure 7:
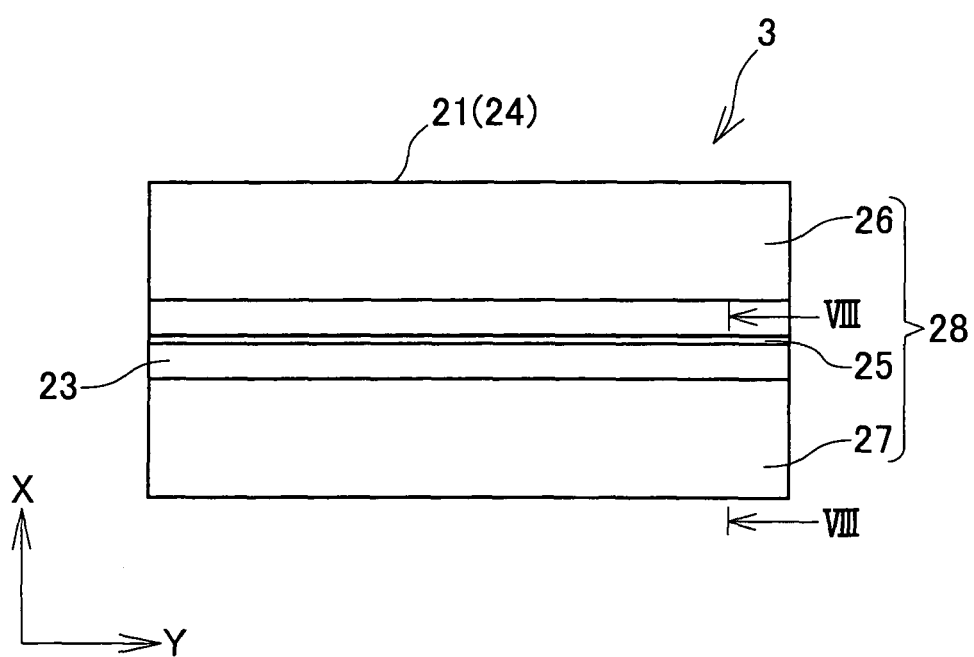
FIG. 7 is a plan view of the semiconductor laser element.
Figure 8:
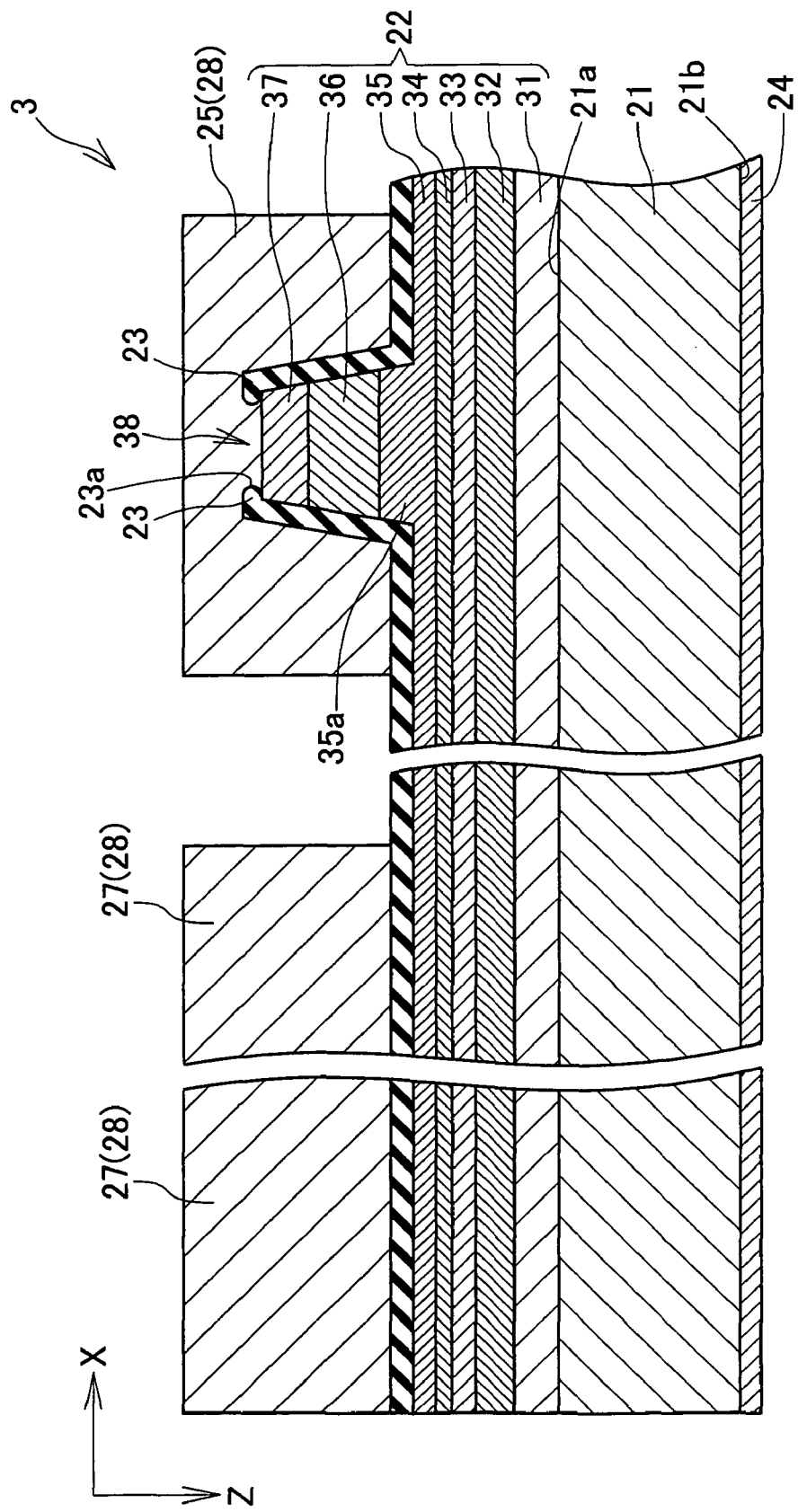
FIG. 8 is a cross-sectional view along the line VIII-VIII in FIG. 7.

FIG. 3 is an overall perspective view of the semiconductor laser device according to the first embodiment. FIG. 4 is a perspective view of a submount. FIG. 5 is a plan view of the submount. FIG. 6 is a perspective view of the semiconductor laser element. FIG. 7 is a plan view of the semiconductor laser element. FIG. 8 is a cross-sectional view along the line VIII-VIII in FIG. 7.

As shown in FIG. 3, a semiconductor laser device 1 according to the first embodiment includes a submount 2 and a semiconductor laser element 3.

As shown in FIG. 3, the submount 2 is for holding the semiconductor laser element 3. As shown in FIGS. 4 and 5, the submount 2 includes a holding substrate 11 and a bonding pad (second bonding pad) 15 having an electrode unit (second electrode unit) 12 and a pair of bonding parts (second bonding parts) 13 and 14.

The holding substrate 11 is made of insulating AlN having high thermal conductivity. Note that the holding substrate 11 may be formed of Si, SiC or the like. In the planar view, the holding substrate 11 has an X-direction width of about 400 µm and a Y-direction length of about 500 µm.

The bonding pad 15 is for bonding to a bonding pad 28 of the semiconductor laser element 3 to be described later. The electrode unit 12 and the bonding parts 13 and 14, all of which form the bonding pad 15, will be described below.

The electrode unit 12 is for electrically connecting the semiconductor laser element 3 to the outside. The electrode unit 12 is formed of Au, Pt (or barrier metal such as Mo and W) and Au, which are laminated on one surface (hereinafter a principal surface) 11a of the holding substrate 11. The electrode unit 12 includes: a connection part 12a to which a p-side electrode unit 25 of the semiconductor laser element 3 to be described later is electrically connected; and an external terminal part 12b to be connected to the outside. The connection part 12a has an X-direction width of about 5 µm.

The bonding parts 13 and 14 are for suppressing reduction in bonding strength of the semiconductor laser element 3. The bonding parts 13 and 14 are formed on the principal surface 11a of the holding substrate 11. The bonding parts 13 and 14 are made of the same material as that of the electrode unit 12 and have the same laminate structure. The bonding parts 13 and 14 are electrically insulated from the electrode unit 12 with a predetermined space therebetween. The bonding parts 13 and 14 are symmetrically formed with respect to the connection part 12a of the electrode unit 12. Each of the bonding parts 13 and 14 has an X-direction width of about 75 μm and a Y-direction length of about 400 μm. The bonding parts 13 and 14 are bonded to bonding parts 26 and 27 of the semiconductor laser element 3 to be described later.

As shown in FIG. 3, the semiconductor laser element 3 is of junction-down type. As shown in FIGS. 6 and 7, the semiconductor laser element 3 includes a substrate 21, a semiconductor laminate portion 22, an insulating film 23, an n-side electrode 24 and the bonding pad (a bonding pad unit, a first bonding pad unit) 28 having the p-side electrode unit (an electrode unit, a first electrode unit) 25 and a pair of bonding parts (bonding parts, first bonding parts) 26 and 27.

The substrate 21 is made of conductive n-type GaN. In the planar view, the substrate 21 has an X-direction length of about 200 μm and a Y-direction length of about 400 μm.

As shown in FIG. 8, the semiconductor laminate portion 22 is laminated on a −Z-direction side surface (hereinafter a principal surface) 21a of the substrate 21. In the semiconductor laminate portion 22, an n-type cladding layer 31, an n-type guide layer 32, an active layer 33, a p-type electron block layer 34, a p-type guide layer 35, a p-type cladding layer 36 and a p-type contact layer 37 are laminated sequentially in this order from the substrate 21 side.

The n-type cladding layer 31 is for trapping light emitted by the active layer 33. The n-type cladding layer 31 is made of an n-type AlGaN layer doped with Si as n-type impurities.

The n-type guide layer 32 is for guiding the light emitted by the active layer 33. The n-type guide layer 32 is made of an n-type GaN layer doped with Si as n-type impurities.

The active layer 33 is for emitting light by stimulated emission. The active layer 33 has a MQW (multiple quantum wells) structure in which a plurality of non-doped InGaN layers (well layers) and GaN layers (barrier layers) are alternately laminated.

The p-type electron block layer 34 is for preventing electrons injected from the n-side electrode 24 from reaching the p-type semiconductor side. The p-type electron block layer 34 is made of a p-type AlGaN layer doped with Mg as p-type impurities.

The p-type guide layer 35 is for guiding the light emitted by the active layer 33. The p-type guide layer 35 is made of a p-type GaN layer doped with Mg as p-type impurities. In an X-direction center portion of the p-type guide layer 35, a convex part 35a is formed.

The p-type cladding layer 36 is for trapping the light emitted by the active layer 33. The p-type cladding layer 36 is formed on the convex part 35a of the p-type guide layer 35. The p-type cladding layer 36 is made of a p-type AlGaN layer doped with Mg as p-type impurities.

The p-type contact layer 37 is for reducing electric resistance between the p-side electrode unit 25 and the semiconductor laminate portion 22. The p-type contact layer 37 is made of a p-type GaN layer doped with Mg as p-type impurities.

On a −Z-direction side of the semiconductor laminate portion 22, a ridge-shaped stripe part 38 is formed. The stripe part 38 is for allowing a current to flow only narrowly. The stripe part 38 is formed in a center portion in the X direction. The stripe part 38 has an X-direction width of 5 μm or less and a Z-direction height of several μm. The stripe part 38 is formed so as to extend throughout the length in the Y direction. The stripe part 38 is formed of the convex part 35a of the p-type guide layer 35, the p-type cladding layer 36 and the p-type contact layer 37.

On both Y-direction end faces of the semiconductor laminate portion 22, a Fabry-Perot cavity having a pair of reflective films (not shown) is provided.

The insulating film 23 is for preventing electrical connection between the bonding pad 28 and the semiconductor laminate portion 22 in a region other than the stripe part 38. The insulating film 23 is made of $ZrO_2$. Note that the insulating film 23 may be formed of an insulating material such as $Al_2O_3$ and $SiO_2$. The insulating film 23 is formed so as to cover approximately the entire area of a −Z-direction side surface of the semiconductor laminate portion 22. In an X-direction center portion of the insulating film 23, an opening 23a for exposing an upper surface of the stripe part 38 is formed. The opening 23a is formed approximately throughout the length in the Y direction. The insulating film 23 is exposed between the p-side electrode unit 25 and the bonding parts 26 and 27.

The n-side electrode 24 is for injecting electrons into the semiconductor laminate portion 22 through the substrate 21. As shown in FIG. 3, a wire 41 made of Au is connected to the n-side electrode 24. The n-side electrode 24 is made of Al ohmic-connected to the substrate 21. The n-side electrode 24 is formed so as to cover a +Z-direction side surface (hereinafter a back surface) 21b of the substrate 21.

The bonding pad 28 is die-bonded to the bonding pad 15 of the submount 2 by use of a solder material containing Au/Sn. The p-side electrode unit 25 and the bonding parts 26 and 27 of the bonding pad 28 will be described below.

The p-side electrode unit 25 is for injecting holes into the semiconductor laminate portion 22 from the stripe part 38. The p-side electrode unit 25 has a laminate structure including Au, Pt (or barrier metal such as Mo and W) and Au. The p-side electrode unit 25 is formed on the stripe part 38 and in the vicinity thereof. The p-side electrode unit 25 has an X-direction width of about 5 μm and a Y-direction length of about 400 μm. Specifically, the p-side electrode unit 25 is formed approximately throughout the length in the Y direction. The p-side electrode unit 25 is ohmic-connected to the upper surface of the stripe part 38 exposed from the insulating film 23. The p-side electrode unit 25 is bonded and electrically connected to the connection part 12a of the electrode unit 12 in the submount 2.

The bonding parts 26 and 27 are for suppressing reduction in bonding strength between the submount 2 and the semiconductor laser element 3. The bonding parts 26 and 27 are bonded to the bonding parts 13 and 14 of the submount 2. As in the case of the p-side electrode unit 25, the bonding parts 26 and 27 have a laminate structure including Au, Pt (or barrier metal such as Mo and W) and Au. The bonding parts 26 and 27 are formed on the insulating film 23. The bonding parts 26 and 27 are formed in symmetrical shapes at symmetrical positions with respect to the p-side electrode unit 25. Each of the bonding parts 26 and 27 has an X-direction width of about 75 μm and a Y-direction length of about 400 μm. Specifically, the bonding parts 26 and 27 are formed in the same shape as that of the bonding parts 13 and 14 of the submount 2. However, the shape of the bonding parts 26 and 27 is not limited thereto but, for example, the bonding parts 13 and 14 of the submount 2 may be formed wider than the bonding parts 26 and 27 to facilitate positioning of the semiconductor laser element 3.

A space of about 22.5 μm is provided between the p-side electrode unit 25 and the bonding part 26 (27). This space electrically insulates the p-side electrode unit 25 from the bonding part 26 (27). Between the p-side electrode unit 25 and the bonding part 26 (27), the insulating film 23 is exposed. Here, the space between the p-side electrode unit 25 and the bonding part 26 (27) is not particularly limited but is preferably 20 μm or more to prevent connection between the p-side electrode unit 25 and the bonding part 26 (27) with a solder material.

Next, operations of the semiconductor laser device 1 will be described.

First, voltages are applied to the n-side electrode 24 and the p-side electrode unit 25 through the wire 41 and the electrode unit 12 of the submount 2. Accordingly, electrons are injected into the semiconductor laminate portion 22 from the n-side electrode 24 and holes are injected into the semiconductor laminate portion 22 from the p-side electrode unit 25. The electrons and holes injected into the semiconductor laminate portion 22 are recombined in the active layer 33 to emit light. The emitted light is guided through the active layer 33 in an population inversion state. Moreover, the light guided in the Y direction travels back and forth between end faces to cause stimulated emission. Thereafter, the light is emitted as a laser beam from one of the end faces.

Next, a method for manufacturing the semiconductor laser device 1 will be described. FIGS. 9 to 14 are views showing steps of manufacturing a semiconductor laser element according to the first embodiment. FIG. 15 is a view showing die bonding between the submount and the semiconductor laser element.

Figure 9:
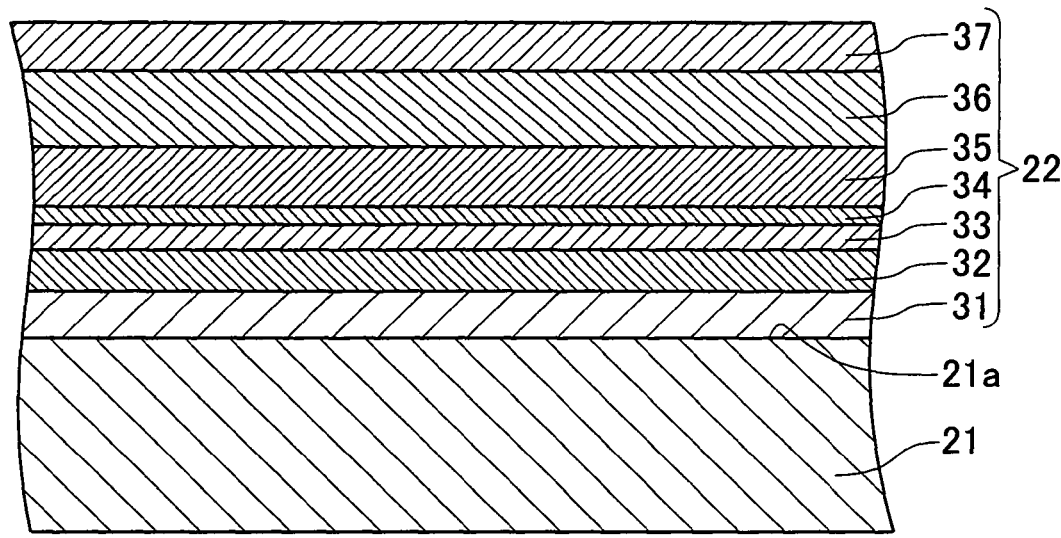
FIG. 9 is a view showing a step of manufacturing a semiconductor laser element according to the first embodiment.

First, as shown in FIG. 9, a substrate 21 is introduced into a chamber of a MOCVD (metalorganic chemical vapor deposition) apparatus (not shown) and a semiconductor laminate portion 22 is sequentially laminated on a principal surface 21a of the substrate 21. Specifically, n-type semiconductor layers 31 and 32 are grown by supplying any of silane gas, TMG (trimethyl gallium), TMA (trimethyl aluminum) and ammonia gas into the chamber of the MOCVD apparatus at a desired flow rate. Next, an active layer 33 is grown by supplying any of TMI (trimethyl indium), TMG and ammonia gas into the chamber at a desired flow rate. Thereafter, p-type semiconductor layers 34 to 37 are formed by supplying any of $Cp_2Mg$ (bis-cyclopentadienyl magnesium) gas, TMA, TMG and ammonia gas into the chamber at a desired flow rate.

Figure 10:
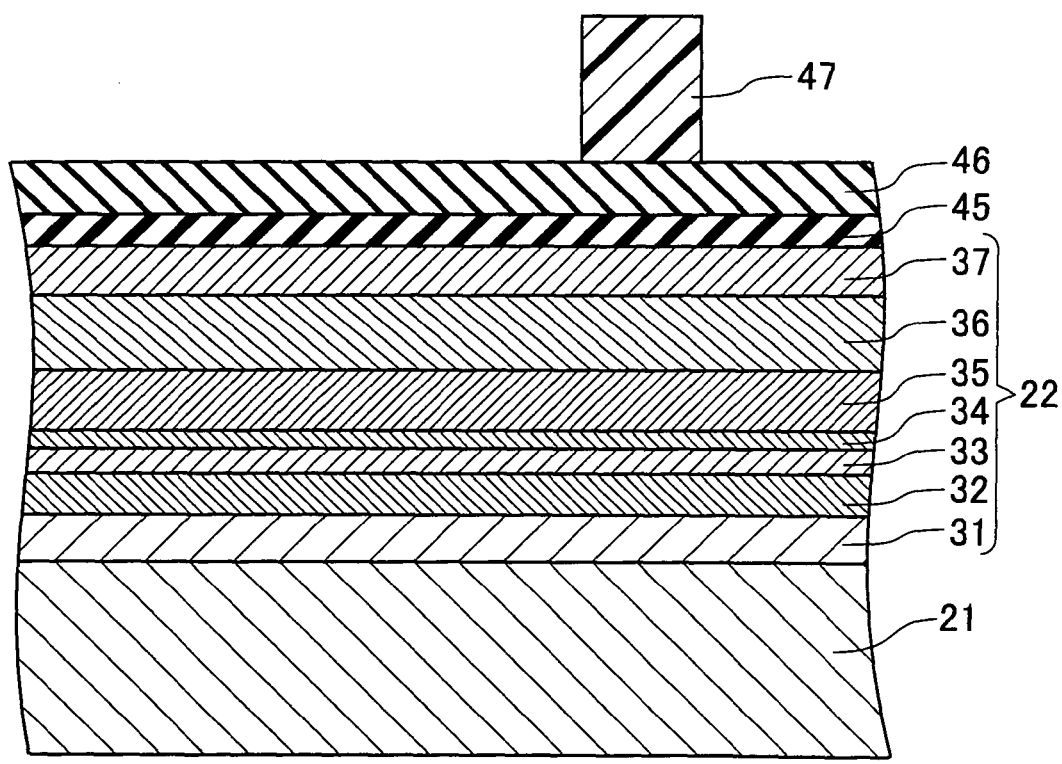
FIG. 10 is a view showing a step of manufacturing a semiconductor laser element according to the first embodiment.

Next, as shown in FIG. 10, a first mask layer 45 made of $SiO_2$ is formed by a sol-gel method. Thereafter, a second mask layer 46 made of a SiN layer is formed by a sputtering method. Here, the first mask layer 45 formed by the sol-gel method has an etching rate higher than that of the second mask layer 46 formed by the sputtering method. Subsequently, a resist film 47 is formed, which is patterned by a photolithography method.

Figure 11:
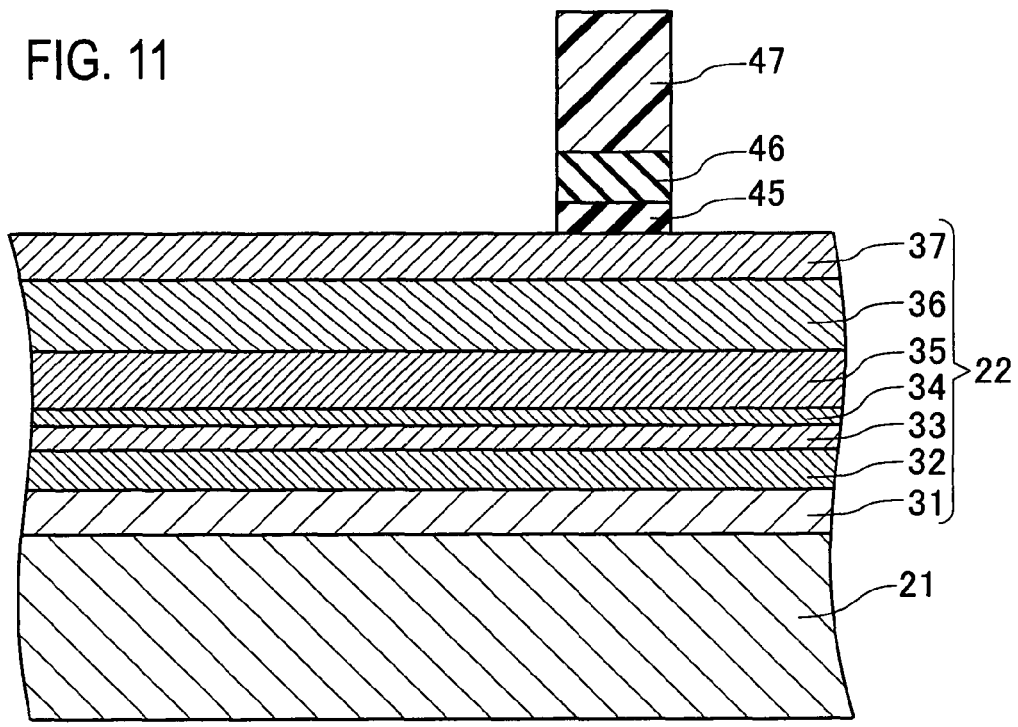
FIG. 11 is a view showing a step of manufacturing a semiconductor laser element according to the first embodiment.

Next, as shown in FIG. 11, the second mask layer 46 and the first mask layer 45 in a region exposed from the resist film 47 are etched. Thereafter, the resist film 47 is removed.

Figure 12:
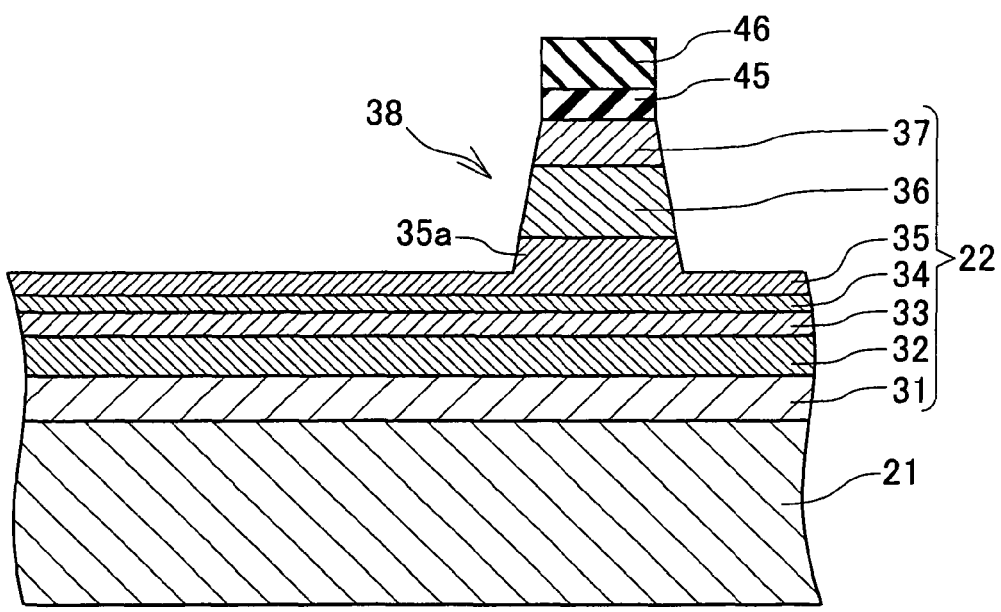
FIG. 12 is a view showing a step of manufacturing a semiconductor laser element according to the first embodiment.

Subsequently, as shown in FIG. 12, a p-type contact layer 37, a p-type cladding layer 36 and a part of a p-type guide layer 35 in a region exposed from the mask layers 45 and 46 are dry-etched. Thus, a stripe part 38 is formed.

Figure 13:
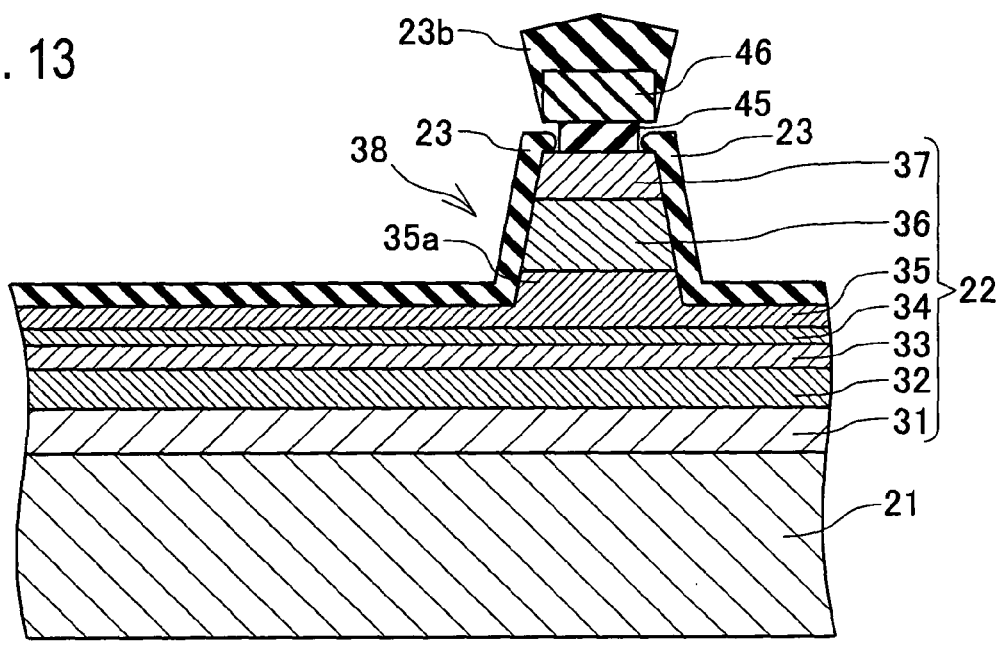
FIG. 13 is a view showing a step of manufacturing a semiconductor laser element according to the first embodiment.

Next, as shown in FIG. 13, side faces of the first mask layer 45 are selectively etched with buffered hydrofluoric acid that is a 1-hydrogen-2-ammonium fluoride solution to expose a part of an upper surface of the p-type contact layer 37. Thereafter, an insulating film 23 made of a $ZrO_2$ layer is formed by the sputtering method. Subsequently, the stripe part 38 is immersed again in the buffered hydrofluoric acid to remove the second mask layer 46 and the first mask layer 45 together with an insulating film 23b on the second mask layer 46.

Figure 14:
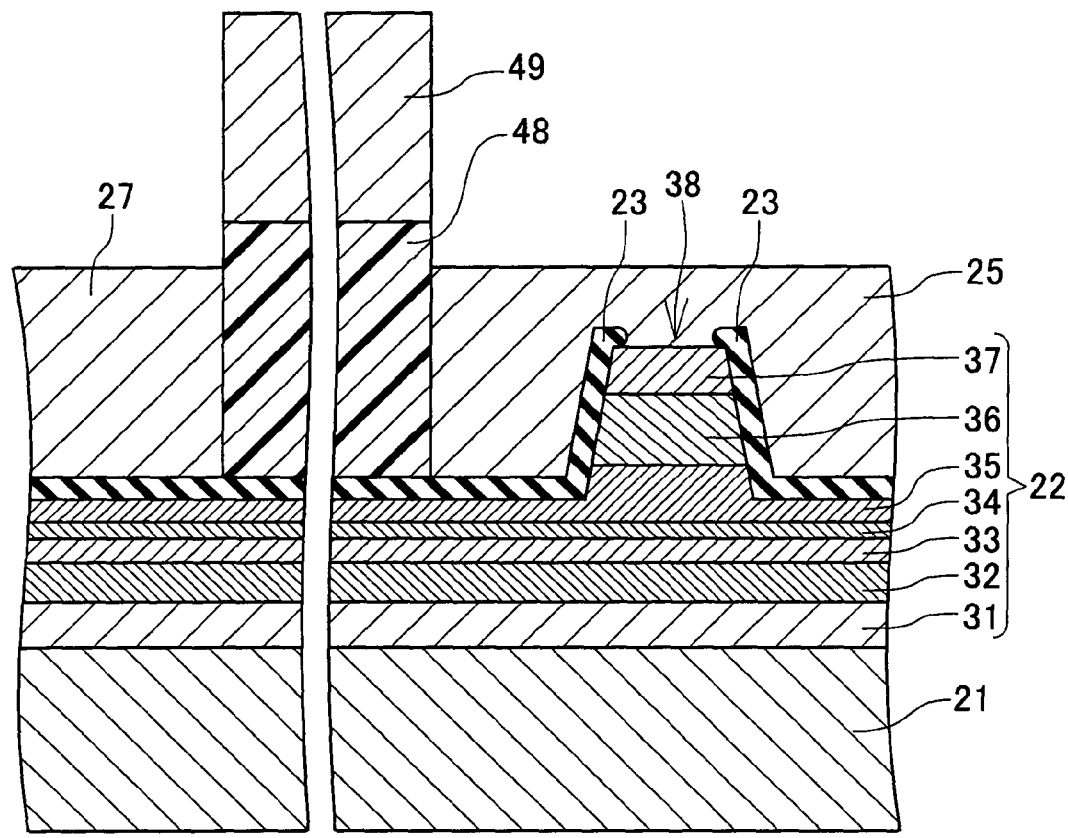
FIG. 14 is a view showing a step of manufacturing a semiconductor laser element according to the first embodiment.
Figure 15:
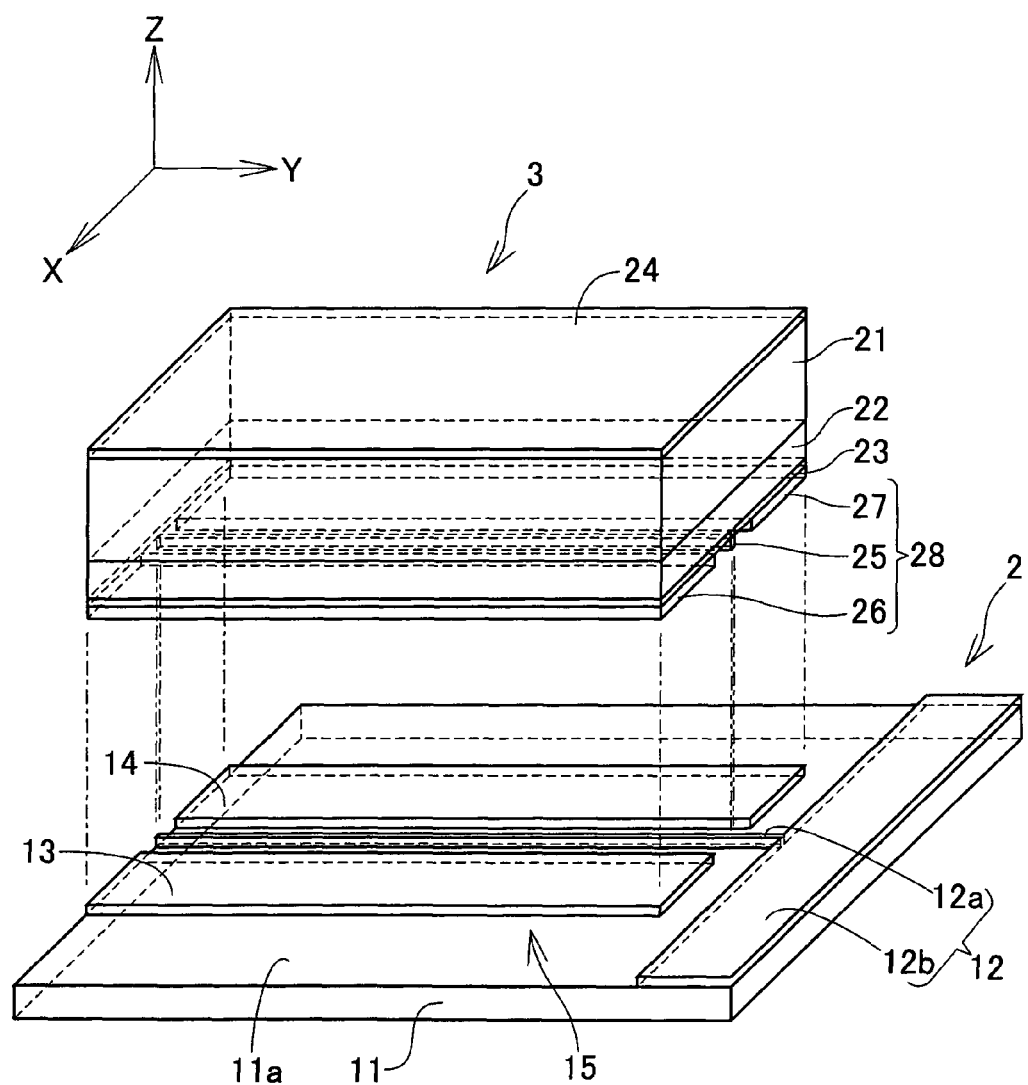
FIG. 15 is a view showing die bonding between the submount and the semiconductor laser element.

Next, as shown in FIG. 14, a resist film 48 is formed by the photolithography method. Thereafter, a bonding pad 28 having a p-side electrode unit 25 and bonding parts 26 and 27 is formed by the sputtering method. Specifically, the p-side electrode unit 25 and the bonding parts 26 and 27 have a laminate structure including Au, Pt and Au. Subsequently, the resist film 48 is removed together with a metal layer 49 thereon.

Next, after polishing a back surface 21b of the substrate 21, an n-side electrode 24 made of Al is formed on the entire back surface 21b of the substrate 21. Thereafter, the substrate is divided into element units. Thus, the semiconductor laser element 3 shown in FIGS. 6 and 7 is completed.

Next, a submount 2 is fabricated through a separate process using the photolithography method, a lift-off technique and the like. Thereafter, as shown in FIG. 15, the submount 2 and the semiconductor laser element 3 are die-bonded to each other. Specifically, a solder material containing Au/Sn is placed on a surface of a bonding pad 15 in the submount 2. In this state, the submount 2 is heated by a heater until the solder material is melted. Next, the submount 2 and the semiconductor laser element 3 are bonded by placing the semiconductor laser element 3 on the submount 2 so as to align the p-side electrode unit 25 and the bonding parts 26 and 27 in the semiconductor laser element 3 with a connection part 12a and bonding parts 13 and 14 in the submount 2. Here, Au/Sn contained in the solder material increases a melting point of the p-side electrode unit 25 and the bonding parts 26 and 27 in the semiconductor laser element 3, thereby facilitating the bonding. Note that, between the p-side electrode unit 25 and the bonding parts 26 and 27, the solder material containing Au/Sn is repelled by the exposed insulating film 23.

As a result, the semiconductor laser device 1 shown in FIG. 3 is completed.

As described above, in the semiconductor laser element 3 of the semiconductor laser device 1 according to the first embodiment, the bonding parts 26 and 27 are arranged with certain spaces from the p-side electrode unit 25. Thus, stresses generated between the semiconductor laser element 3 and the solder material at the positions of the bonding parts 26 and 27 can be prevented from being directly transmitted to the p-side electrode unit 25.

Moreover, the bonding parts 26 and 27 and the p-side electrode unit 25 are insulated from each other by providing certain spaces therebetween. Thus, generation of unnecessary capacitances between the semiconductor laminate portion 22 and the bonding parts 26 and 27 can be suppressed. To be more specific, in the case where the bonding pad is formed on the entire surface of the insulating film as in the conventional case, an area of the bonding pad turns out to be 200 μm×400 μm=$8\times10^4$ μm$^2$ and this total area contributes to the capacitance. Meanwhile, in the bonding pad 28 according to the first embodiment, only the p-side electrode unit 25 having an area of 5 μm×400 μm=$0.2\times10^4$ μm$^2$ contributes to the capacitance. Specifically, in theory, the capacitance can be suppressed to 1/40 in the first embodiment compared with the conventional embodiment. Furthermore, high-frequency superposition is thus easily performed, which leads to improved response in high-speed pulse drive. Moreover, the semiconductor laser element 3 has not only the p-side electrode unit 25 but also the bonding parts 26 and 27 die-bonded to the bonding pad 15 in the submount 2. Thus, reduction in bonding strength can be suppressed. As a result, unnecessary capacitances can be reduced while suppressing reduction in bonding strength.

Moreover, in the semiconductor laser element 3, the bonding parts 26 and 27 are symmetrically formed with respect to the p-side electrode unit 25. Thus, bonding balance can be improved. Similarly, in the submount 2, the bonding parts 13 and 14 are symmetrically formed with respect to the connection part 12*a*. Thus, bonding balance can be improved.

Moreover, in the semiconductor laser element 3, the p-side electrode unit 25 and the bonding parts 26 and 27 are formed of the same material and thus can be formed by the same manufacturing process. Accordingly, the manufacturing process can be prevented from becoming complex.

Moreover, the solder material for bonding the bonding pad 15 to the bonding pad 28 contains Au/Sn. Thus, a melting point of Au on the surface of the bonding pad 28 in the semiconductor laser element 3 can be increased. As a result, the bonding pads 15 and 28 are bonded by a small pressing force. Furthermore, since the insulating film 23 repels the solder material containing Au/Sn, electrical connection between the p-side electrode unit 25 and the bonding parts 26 and 27 can be prevented.

Figure 1:
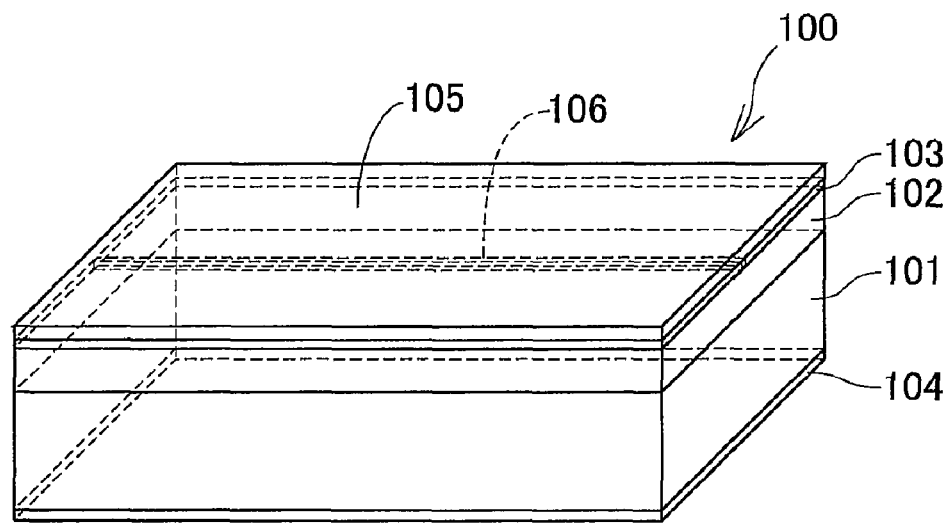
FIG. 1 is a perspective view of a conventional semiconductor light emitting element.
Figure 2:
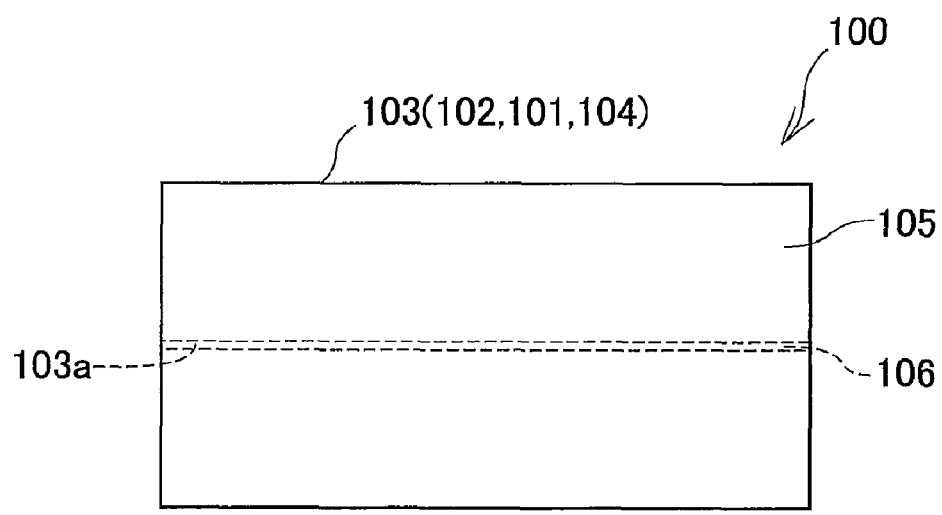
FIG. 2 is a plan view of the conventional semiconductor light emitting element.

Note that, in the conventional configuration described with reference to FIGS. 1 and 2, the bonding pad 105 is formed so as to cover the entire surface of the insulating film 103. This causes the semiconductor laminate portion 102 and the bonding pad 105 to have a capacitor structure in the region other than the stripe part 106. Therefore, there is a problem that unnecessary capacitances are generated. Here, it is conceivable that the capacitances are reduced by narrowing the bonding pad 105. However, when the bonding pad 105 is simply narrowed, there arises a problem that bonding strength with the submount is reduced.

Second Embodiment

Figure 16:
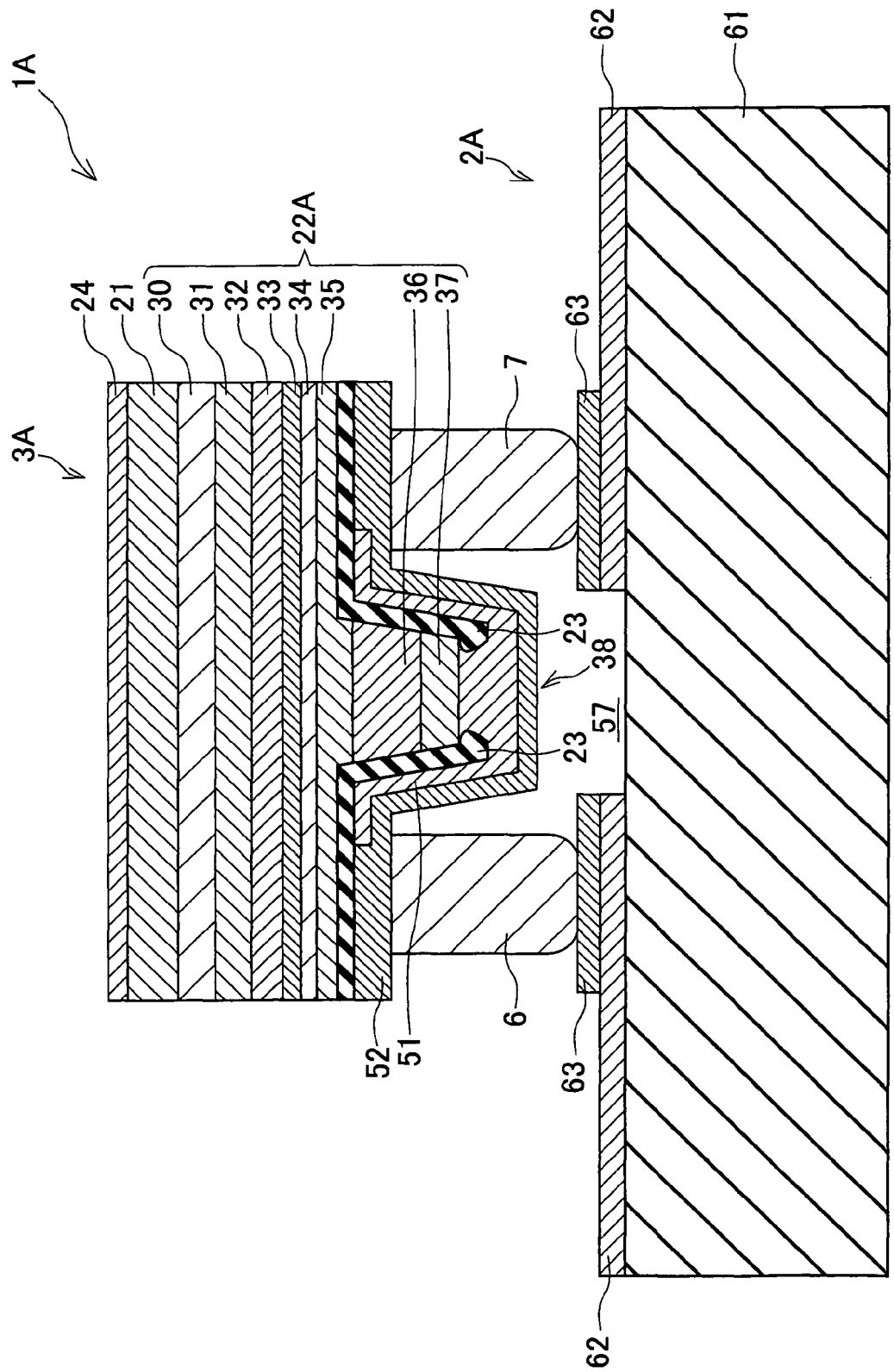
FIG. 16 is a cross-sectional view of a semiconductor laser device according to a second embodiment.
Figure 17:
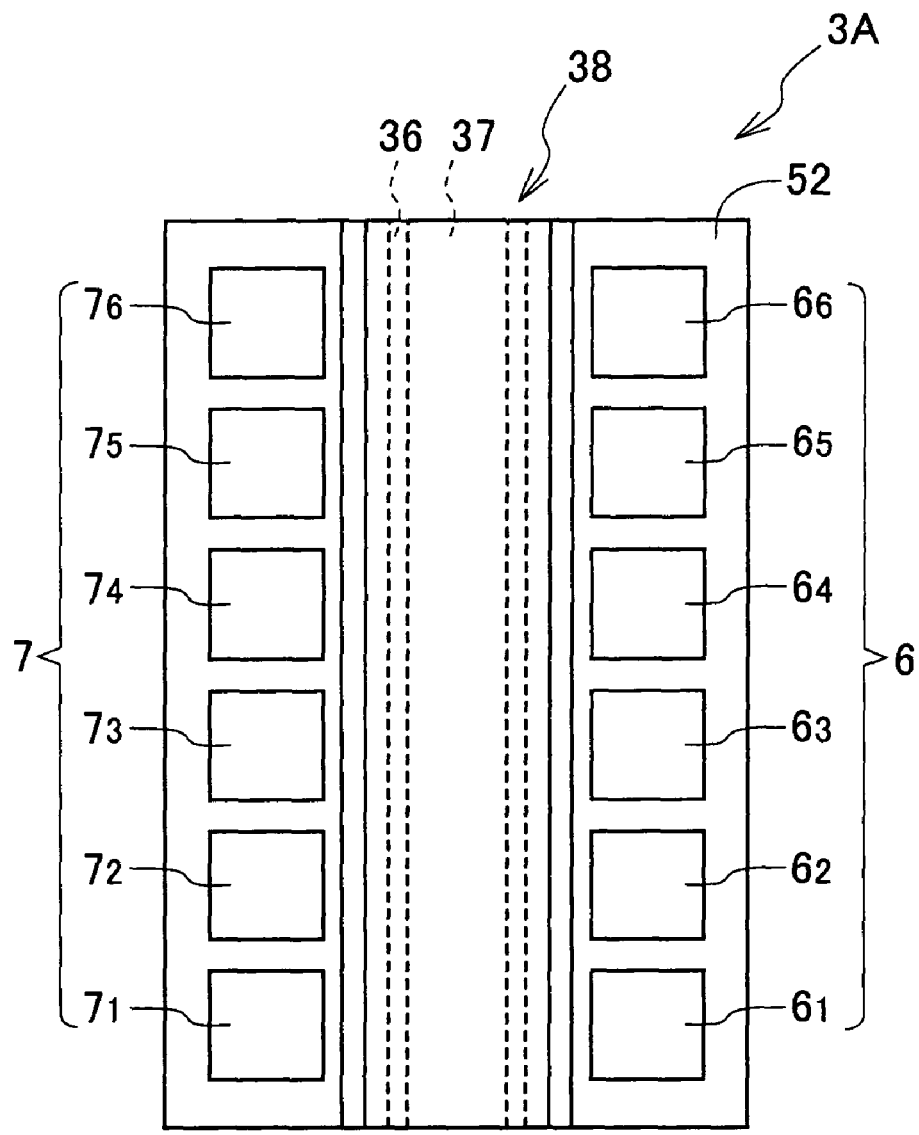
FIG. 17 is a plan view of a semiconductor laser element according to the second embodiment.
Figure 18:
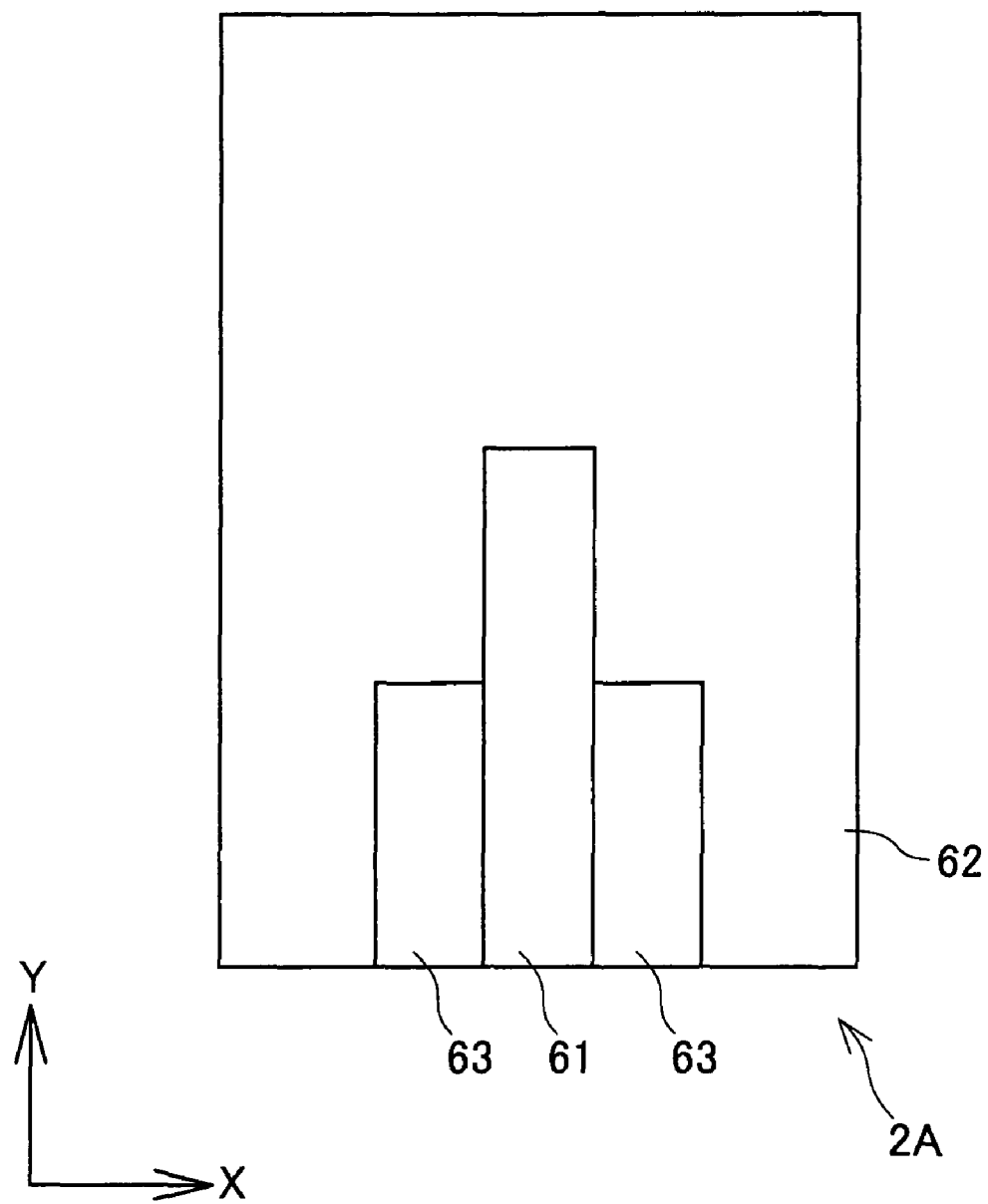
FIG. 18 is a plan view of a submount.
Figure 19:
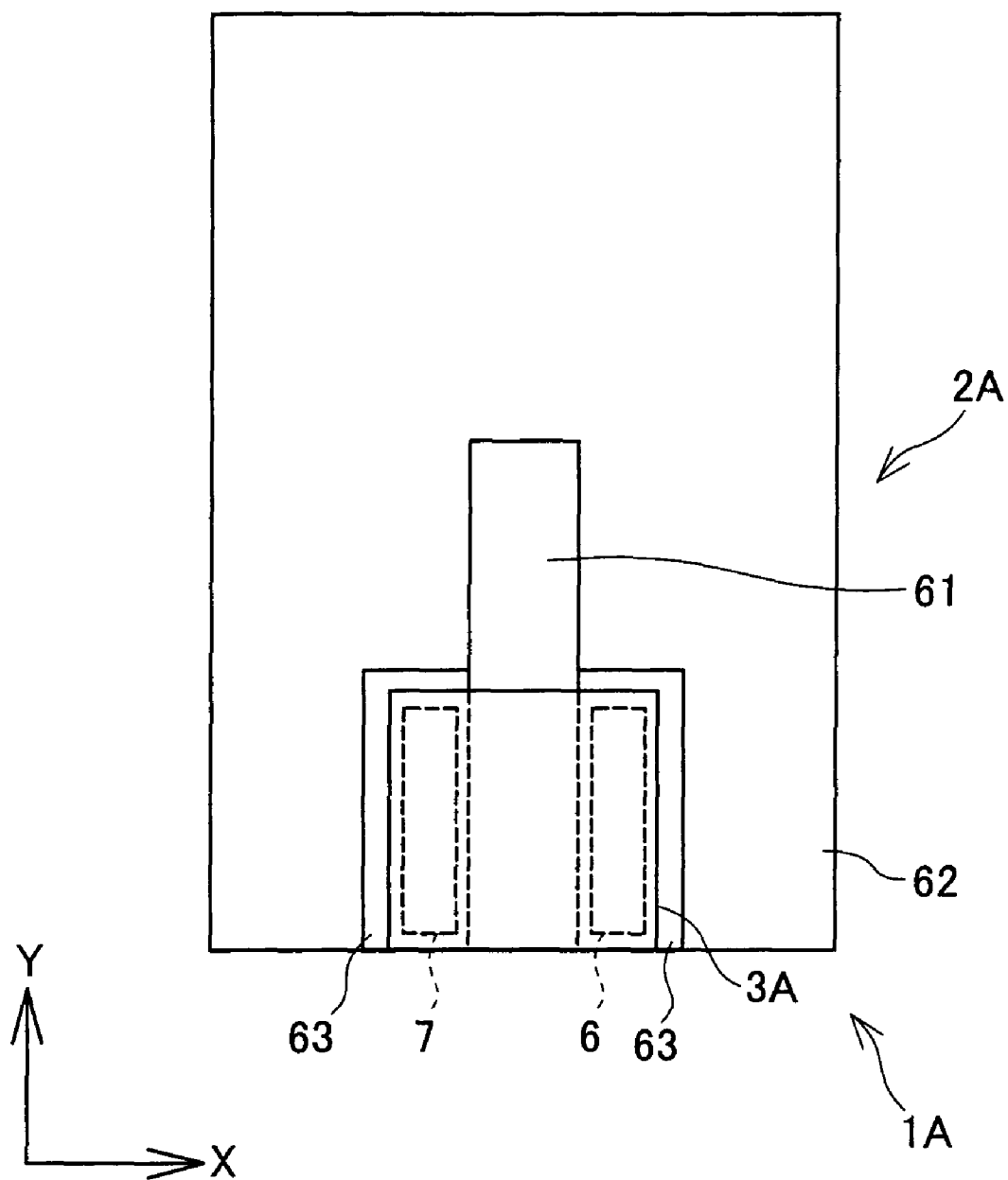
FIG. 19 is a plan view of the semiconductor laser device.

Next, description will be given of a semiconductor laser device of junction-down type according to a second embodiment obtained by partially modifying the embodiment described above. FIG. 16 is a cross-sectional view of the semiconductor laser device according to the second embodiment. FIG. 17 is a plan view of a semiconductor laser element. FIG. 18 is a plan view of a submount. FIG. 19 is a plan view of the semiconductor laser device. Note that the same components as those of the embodiment described above are denoted by the same reference numerals and description thereof will be omitted. Note also that the semiconductor laser device of junction-down type according to the second embodiment corresponds to the semiconductor light emitting device of junction-down type according to claim 7.

As shown in FIGS. 16 to 19, a semiconductor laser device 1A according to the second embodiment includes a submount 2A, a semiconductor laser element 3A and a solder material layer 63.

As shown in FIGS. 16 and 17, the semiconductor laser element 3A includes a substrate 21, a semiconductor laminate portion 22A, an insulating film 23, a first p-side electrode unit 51, a second p-side electrode unit 52, a pair of stripe protection parts 6 and 7 and an n-side electrode 24. In the planar view, the semiconductor laser element 3A is formed in a rectangular shape in which a side in a Y direction is longer than that in an X direction. However, the shape of the semiconductor laser element 3A is not limited thereto but the side in the X direction can be set longer than that in the Y direction. In an upper part of an X-direction center portion of the semiconductor laser element 3A, a convex stripe part 38 for injecting carriers (holes) is formed, which protrudes compared with other regions.

The semiconductor laminate portion 22A includes an n-type contact layer 30 and respective layers 31 to 37. The n-type contact layer 30 is made of an n-type GaN layer doped with Si.

The p-side electrode units 51 and 52 are for injecting holes into the semiconductor laminate portion 22A from the stripe part 38. The first p-side electrode unit 51 has a metal laminate structure including Pd/Au. The first p-side electrode unit 51 is formed so as to cover the stripe part 38 and the vicinity thereof. The first p-side electrode unit 51 is ohmic-connected to an exposed upper surface of a p-type contact layer 37 in the stripe part 38. The second p-side electrode unit 52 has a metal laminate structure including Ti/Au. The second p-side electrode unit 52 is formed so as to cover an upper surface of the first p-side electrode unit 51 and an upper surface of the insulating film 23. The second p-side electrode unit 52 is electrically connected to an electrode pattern 62 through the stripe protection parts 6 and 7. Moreover, a space 57 is provided between the second p-side electrode unit 52 and a holding substrate 61 so as to prevent direct connection between a center portion of the second p-side electrode unit 52 and the holding substrate 61.

The stripe protection parts 6 and 7 are for protecting the stripe part 38. The pair of stripe protection parts 6 and 7 are formed at positions facing each other across the stripe part 38. The stripe part 38 and the stripe protection parts 6 and 7 are formed parallel to each other. However, the configuration of the stripe part 38 and the stripe protection parts 6 and 7 is not limited to the parallel configuration. The space between the stripe protection parts 6 and 7 is set to be about 20 μm or less. Upper surfaces of the stripe protection parts 6 and 7 are set to be higher than an upper surface of the stripe part 38 by about 100 nm or more. Note that the upper surfaces mentioned here are surfaces on the submount 2A side.

Moreover, the stripe protection parts 6 and 7 electrically connect the p-side electrode units 51 and 52 to the electrode pattern 62. The stripe protection parts 6 and 7 are made of Au and electrically connected to a p-side electrode 5.

The stripe protection part 6 (7) is divided into a plurality of blocks $6_1$ to $6_6$ ($7_1$ to $7_6$) in the Y direction. The blocks $6_1$ to $6_6$ ($7_1$ to $7_6$) are arranged at intervals (for example, several μm) along the Y direction.

The submount 2A includes the holding substrate 61 and the electrode pattern 62 formed on the holding substrate 61. The electrode pattern 62 is electrically connected to the stripe protection parts 6 and 7 through the solder material layer 63. The electrode pattern 62 is not formed in a region facing the stripe part 38. Here, a melting point of the solder material layer 63 is about 300° C. in the case of a Au-rich AuSn layer, and is 230° C. or higher in the case of a Sn-rich layer. Note that the solder material layer 63 is not formed between the stripe part 38 and the holding substrate 61.

As described above, in the semiconductor laser element 3A according to this embodiment, the pair of stripe protection parts 6 and 7 higher than the stripe part 38 are provided so as to sandwich the stripe part 38 therebetween. Thus, in an assembly process using a collet (not shown) or the like, the stripe part 38 can be prevented from coming into contact with the device. As a result, breakage of the stripe part 38 can be prevented.

Moreover, the stripe protection parts 6 and 7 have conductivity and are electrically connected to the second p-side electrode unit 52. Thus, since the second p-side electrode unit 52 and the electrode pattern 62 can be connected to each other through the stripe protection parts 6 and 7, it is not required to directly connect the electrode pattern 62 and the semiconductor laminate portion 22A to each other. Here, since the stripe protection parts 6 and 7 are formed to be higher than the stripe part 38, the space 57 can be formed between the holding substrate 61 and the upper surface of the second p-side electrode unit 52. Accordingly, impact in bonding to the electrode pattern 62 can be prevented from being transmitted to the stripe part 38. Thus, breakage of the stripe part 38 can be prevented.

Moreover, the stripe protection part 6 (7) is divided into the plurality of blocks 6$_1$ to 6$_6$ (7$_1$ to 7$_6$) Thus, even when the stripe protection part 6 (7) having a high thermal expansion coefficient is formed on the semiconductor laminate portion 22A having a low thermal expansion coefficient, gaps between the blocks 6$_1$ to 6$_6$ (7$_1$ to 7$_6$) can absorb expansion. Thus, in heating such as bonding of the electrode pattern 62, the substrate 21 and the semiconductor laminate portion 22A can be prevented from being damaged by cracks or the like caused by stress attributable to a difference in thermal expansion coefficient.

Moreover, by providing the pair of stripe protection parts 6 and 7 at the positions facing each other across the stripe part 38, the electrode pattern 62 can be connected over the pair of stripe protection parts 6 and 7. Thus, since holes can be injected from both of the stripe protection parts 6 and 7, a hole injection region can be prevented from being biased.

Moreover, in the semiconductor laser device 1A according to the second embodiment, the solder material layer 63 is not formed directly on the stripe part 38. Thus, even if heating is performed up to the melting point of the solder material layer 63 in bonding the stripe protection parts 6 and 7 to the solder material layer 63, the stripe part 38 can be prevented from being damaged by stress attributable to a difference in linear expansion coefficient between the solder material layer 63 and the stripe protection parts 6 and 7. Note that, in general, a linear expansion coefficient of a semiconductor such as GaAs and GaN is $3 \times 10^{-6}$ to $7 \times 10^{-6}$ [$K^{-1}$] and a linear expansion coefficient of metal forming the solder material layer 63 often exceeds $10 \times 10^{-6}$ [$K^{-1}$]. Particularly, the configuration of this embodiment is effective for a GaN semiconductor laser element and a long resonator semiconductor laser element, which are vulnerable to stress.

Moreover, the semiconductor laser device 1A can improve stability of radiation properties and a luminous point by adopting the junction-down structure.

Third Embodiment

Figure 20:
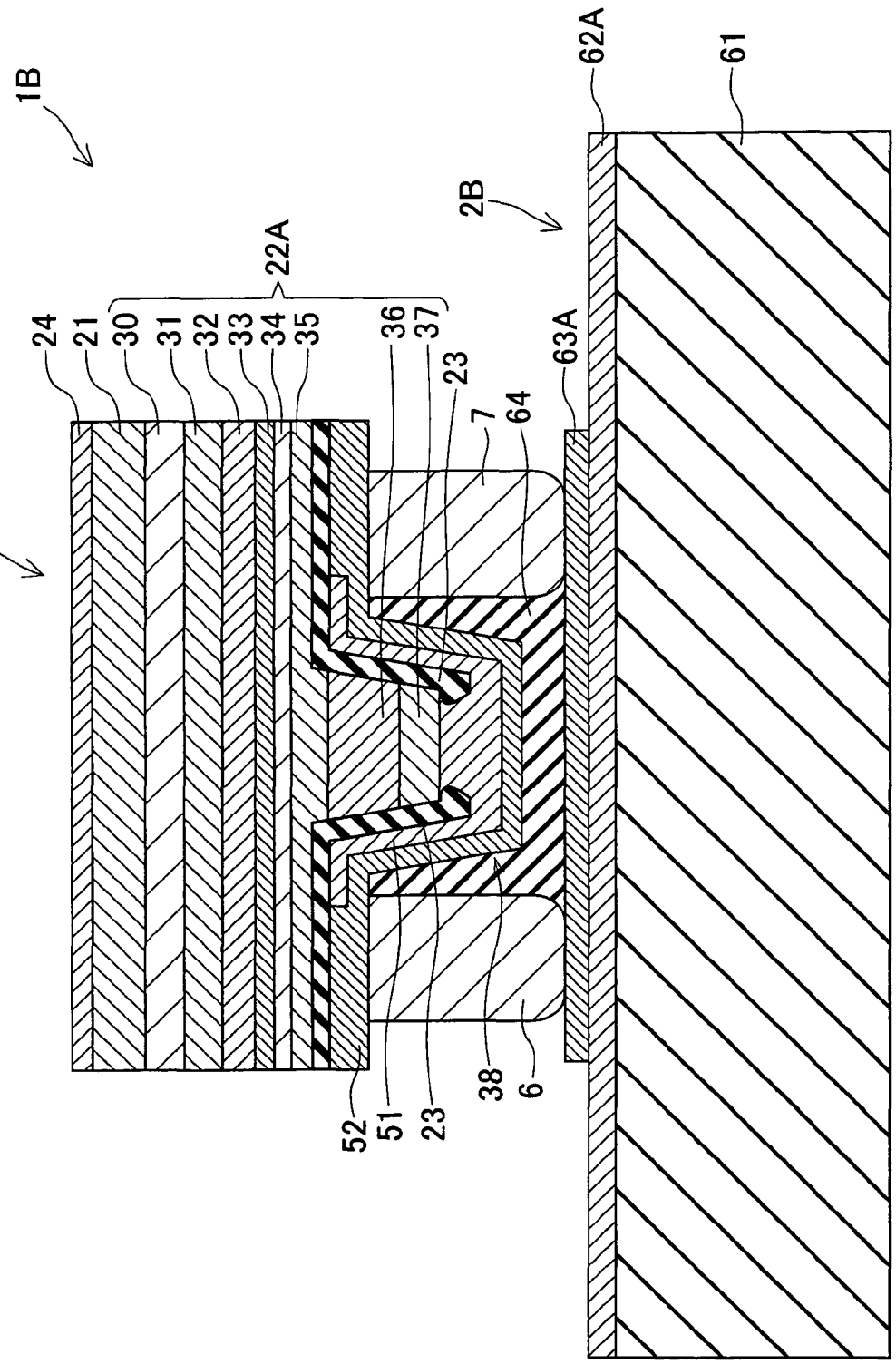
FIG. 20 is a cross-sectional view of a semiconductor laser device according to a third embodiment.
Figure 21:
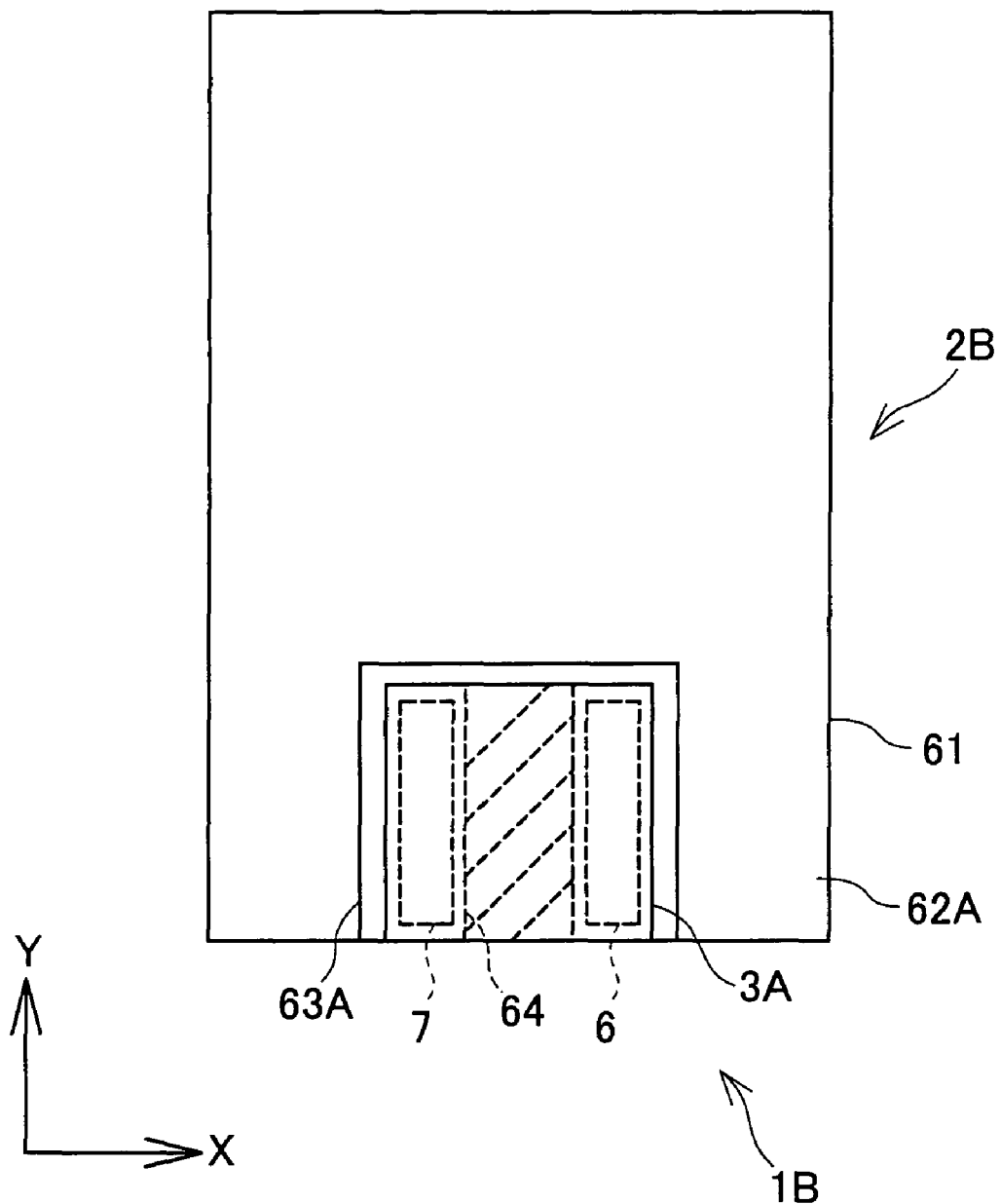
FIG. 21 is a plan view of the semiconductor laser device.

Next, description will be given of a semiconductor laser device of junction-down type according to a third embodiment obtained by partially modifying the embodiment described above. FIG. 20 is a cross-sectional view of the semiconductor laser device according to the third embodiment. FIG. 21 is a plan view of the semiconductor laser device. Note that the same components as those of the embodiment described above are denoted by the same reference numerals and description thereof will be omitted.

As shown in FIGS. 20 and 21, in a semiconductor laser device 1B according to the third embodiment, a stress buffer film 64 is formed so as to cover a stripe part 38. Moreover, an electrode pattern 62A and a solder material layer 63A in a submount 2B are also formed in a region facing the stripe part 38. The stress buffer film 64 is made of a material with low adhesion to the solder material layer 63A such as $SiO_2$. Thus, since the solder material layer 63A is repelled by the stress buffer film 64, the stress buffer film 64 and the solder material layer 63A are released from each other. As a result, generation of stress can be suppressed between the stress buffer film 64 and the solder material layer 63A and this stress can be prevented from being transmitted to the stripe part 38.

Note that the stress buffer film 64 may be formed of an elastic member such as Si gel and polyimide resin. This stress buffer film 64 can also prevent transmission of stress to the stripe part 38. Moreover, as in the case of the second embodiment, the electrode pattern 62 and the solder material layer 63, which are not formed in the region facing the stripe part 38, may also be used.

Fourth Embodiment

Figure 22:
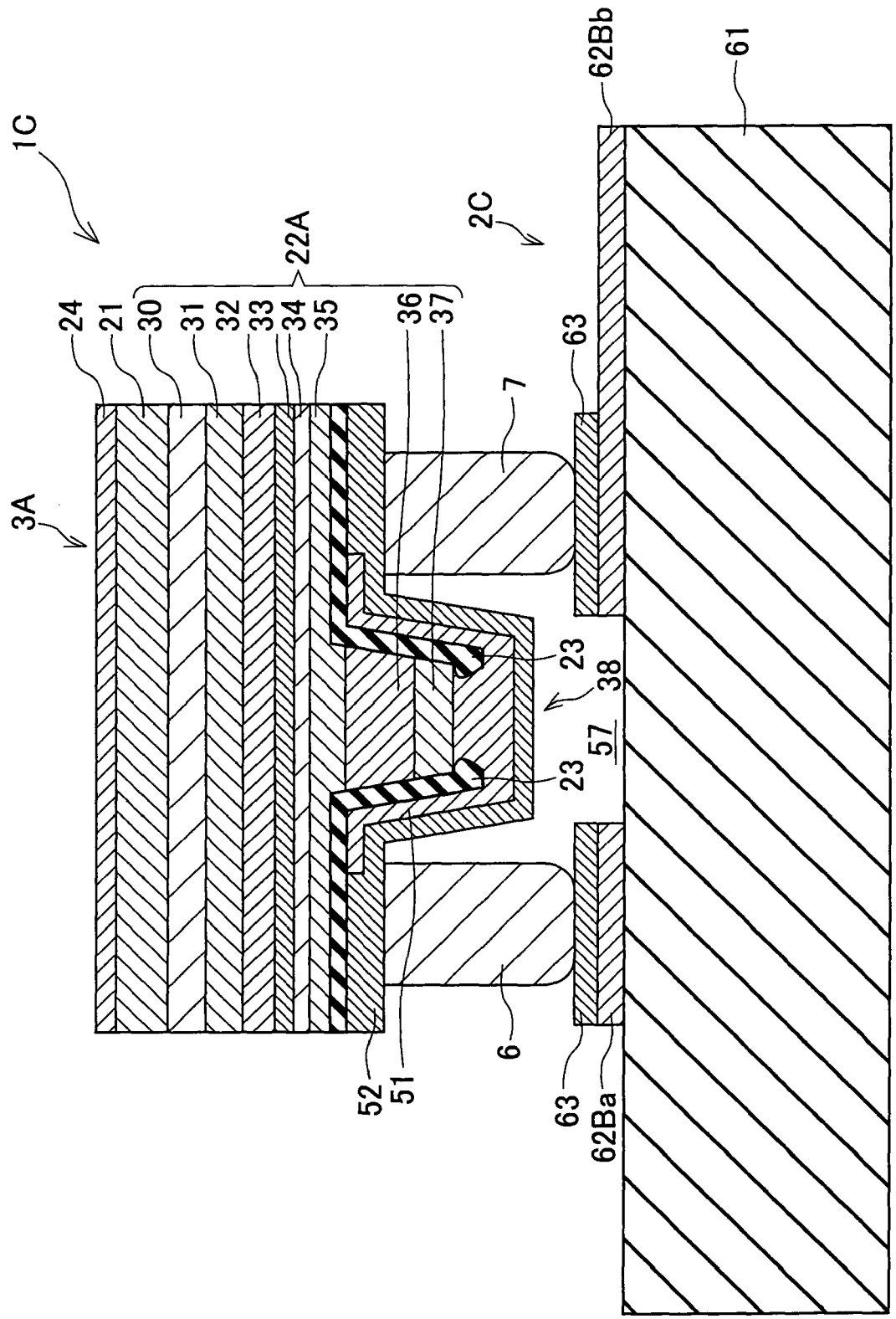
FIG. 22 is a cross-sectional view of a semiconductor laser device according to a fourth embodiment.
Figure 23:
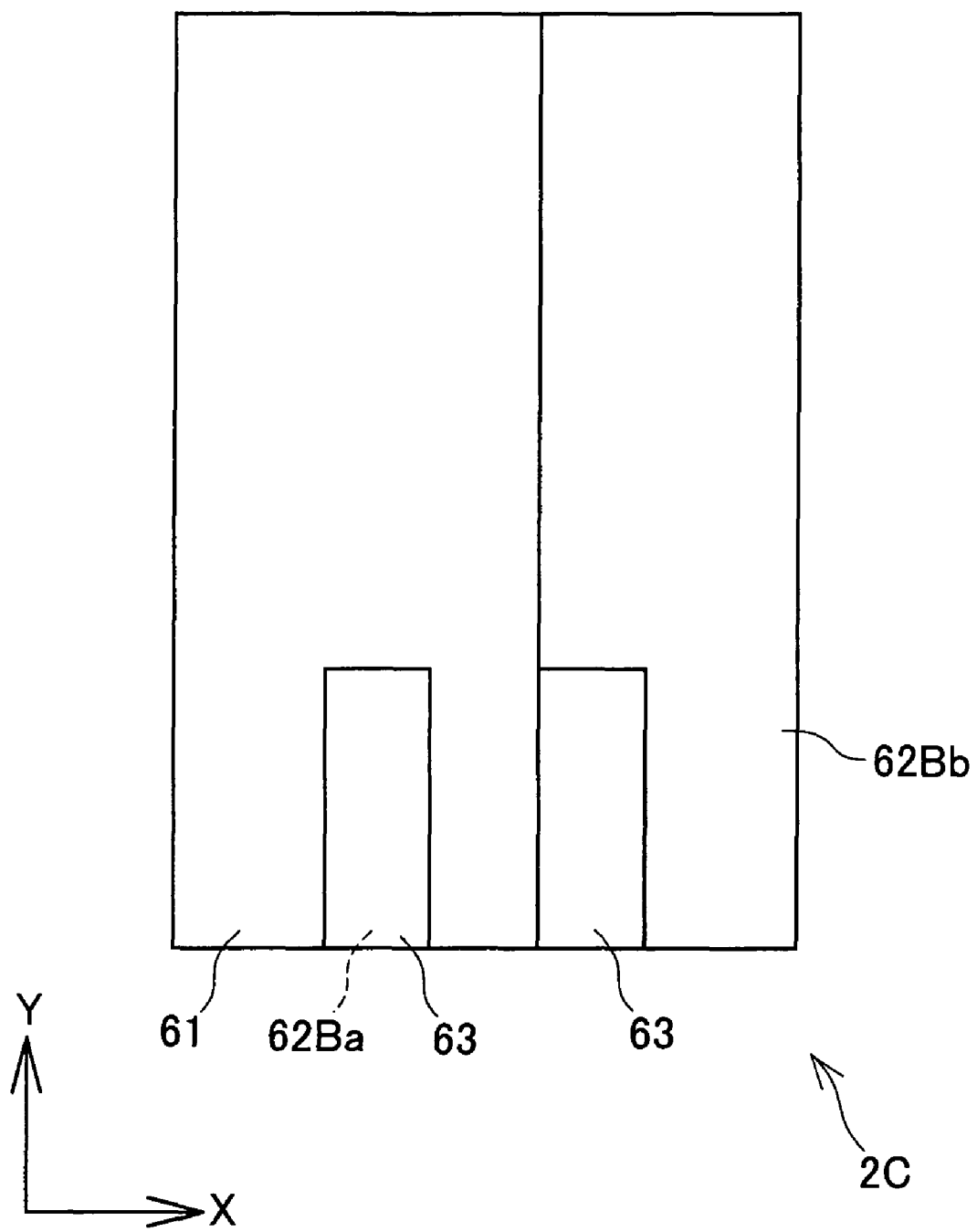
FIG. 23 is a plan view of a submount.
Figure 24:
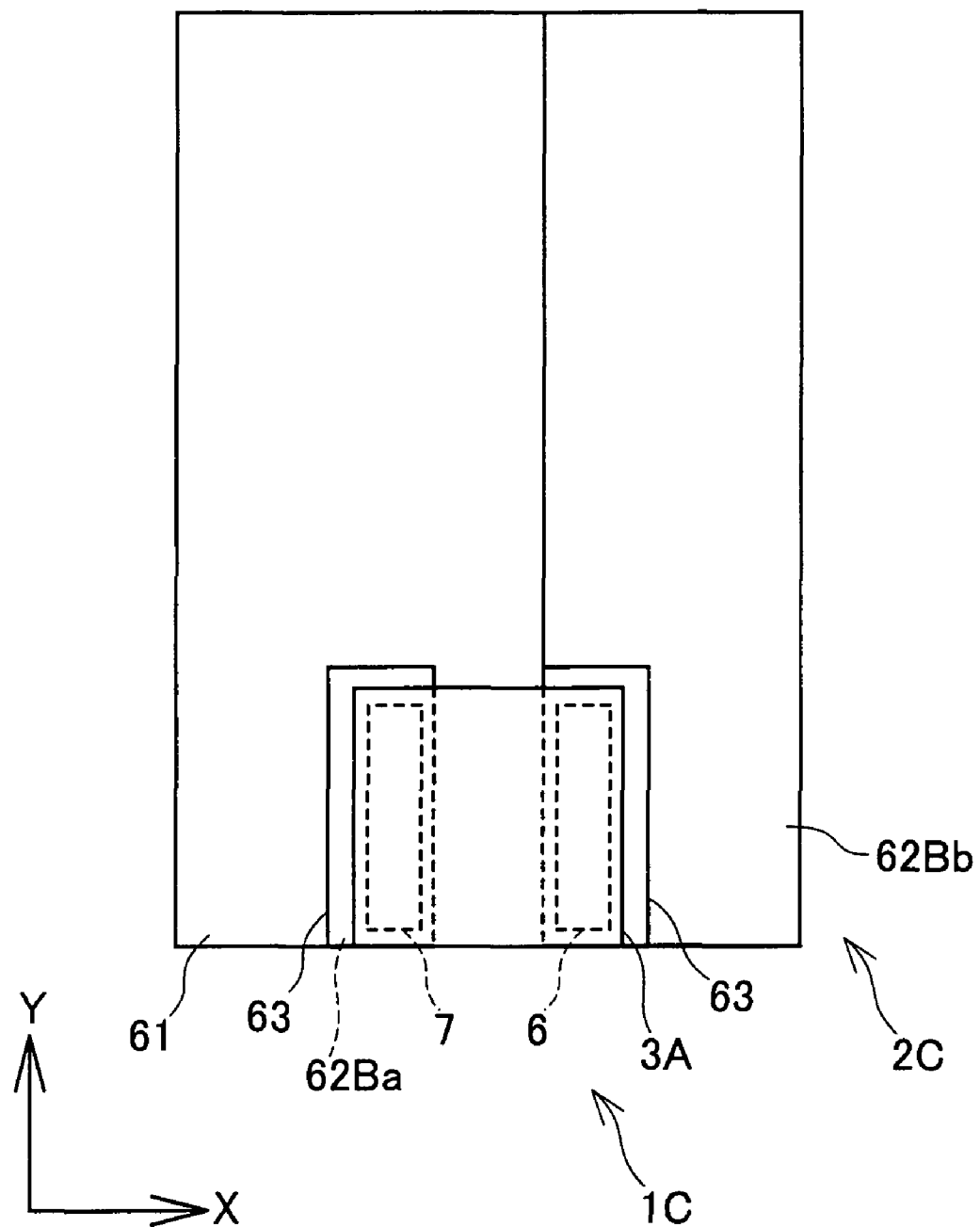
FIG. 24 is a plan view of the semiconductor laser device.

Next, description will be given of a semiconductor laser device of junction-down type according to a fourth embodiment obtained by partially modifying the embodiment described above. FIG. 22 is a cross-sectional view of the semiconductor laser device according to the fourth embodiment. FIG. 23 is a plan view of a submount. FIG. 24 is a plan view of the semiconductor laser device. Note that the same components as those of the embodiment described above are denoted by the same reference numerals and description thereof will be omitted.

In a semiconductor laser device 1C according to the fourth embodiment, as shown in FIGS. 22 to 24, electrode patterns 62Ba and 62Bb are formed in a submount 2C. Specifically, the electrode pattern 62Ba is for aligning a height with the electrode pattern 62Bb and is not connected to the outside. Therefore, the electrode pattern 62Ba may be formed at least only in a region facing a stripe protection part 7. The electrode pattern 62Bb is connected to a stripe protection part 6 and also to the outside. Therefore, the electrode pattern 62Bb is formed at least in a region facing the stripe protection part 6 and in a region connected to the outside.

Note that the stress buffer film 64 in the third embodiment may be applied in the semiconductor laser device 1C according to the fourth embodiment.

Fifth Embodiment

Figure 25:
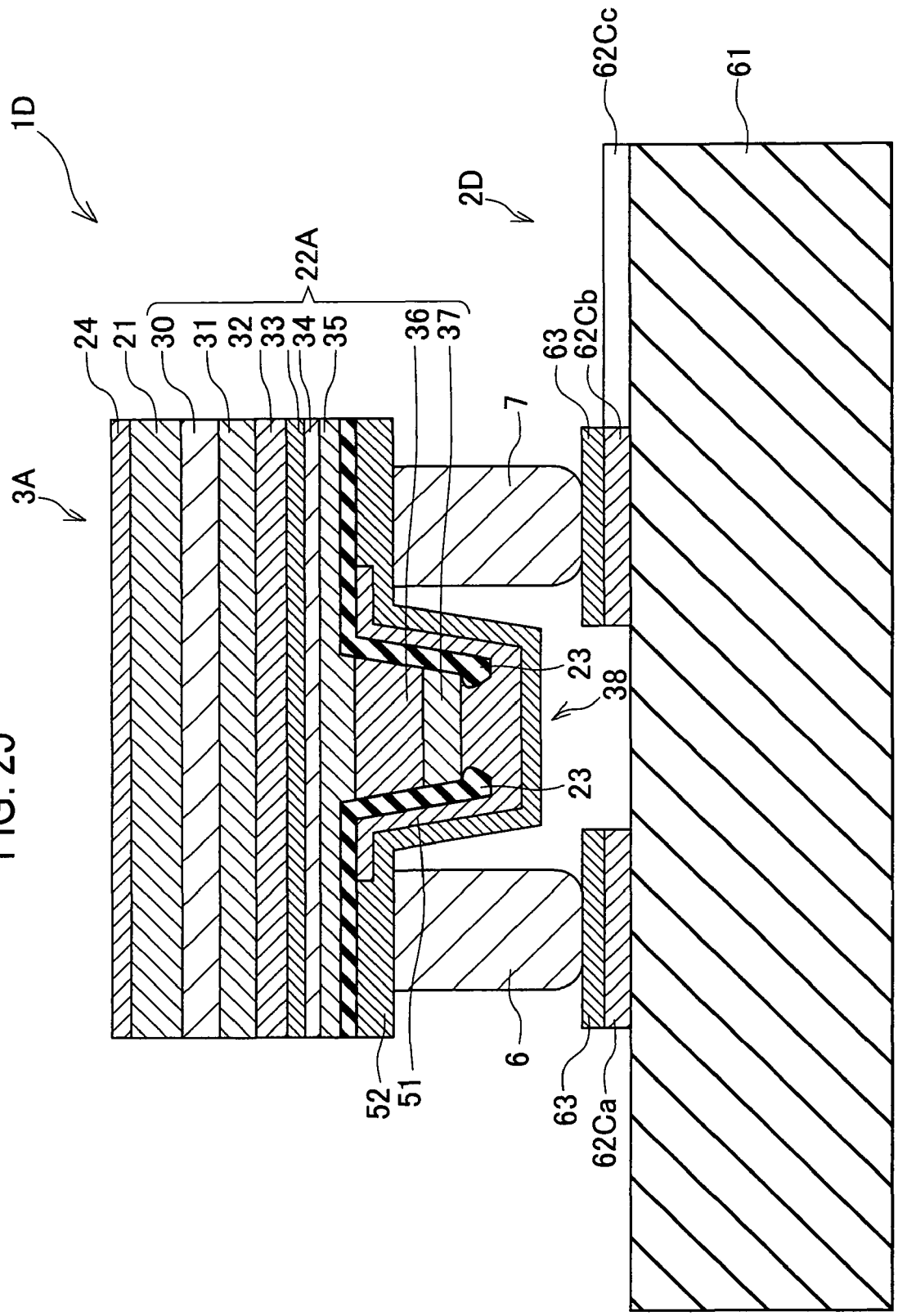
FIG. 25 is a cross-sectional view of a semiconductor laser device according to a fifth embodiment.
Figure 26:
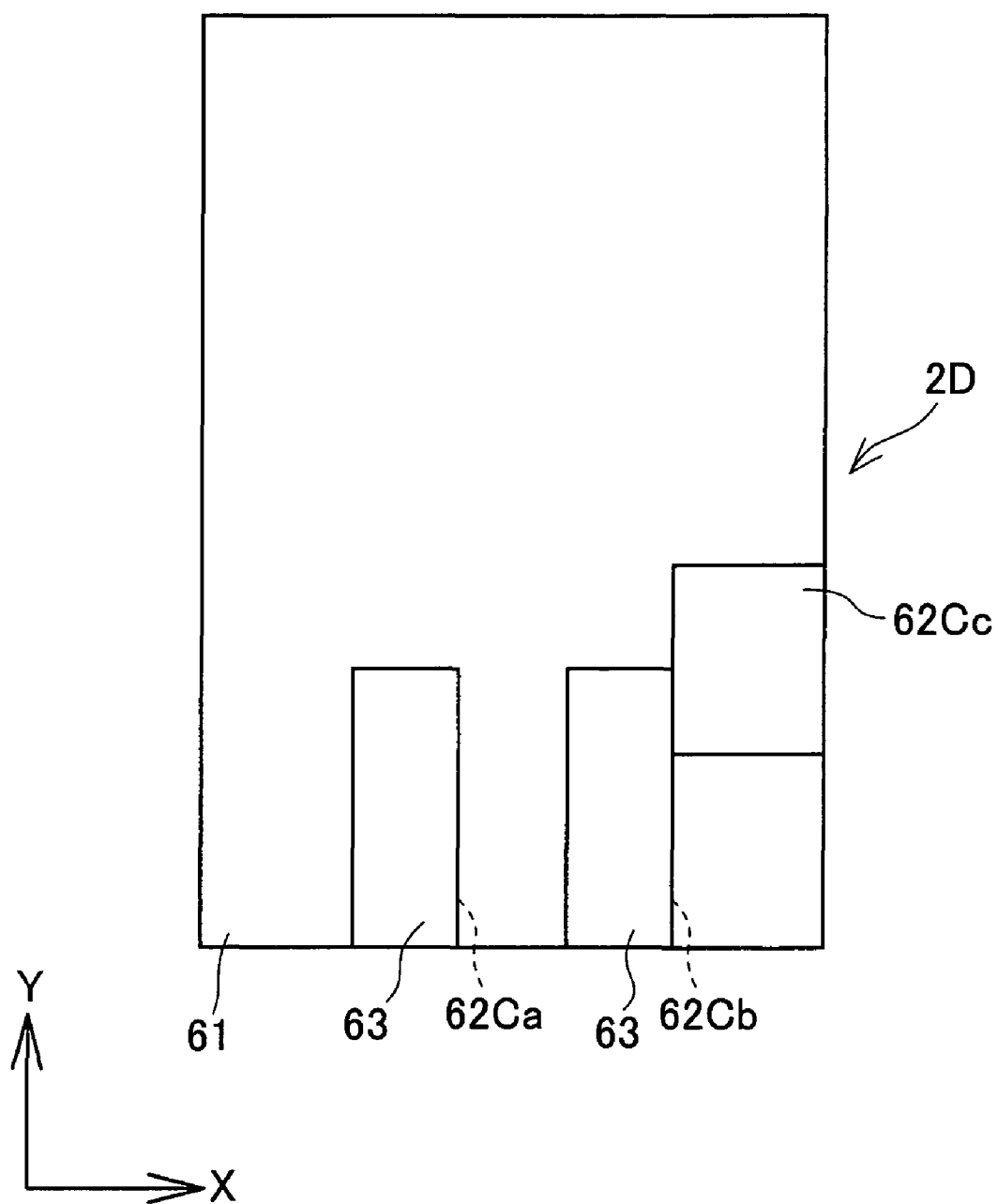
FIG. 26 is a plan view of a submount.
Figure 27:
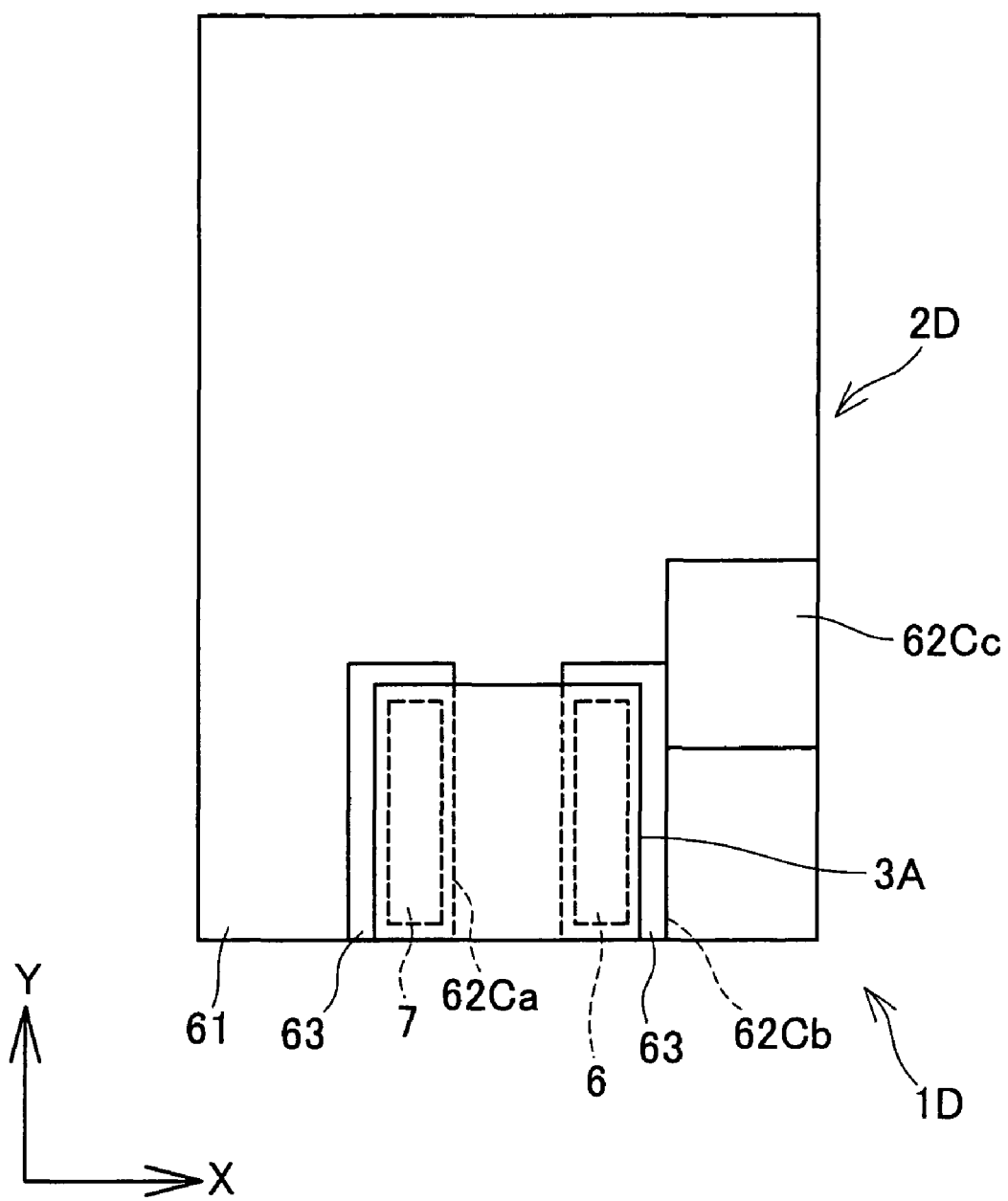
FIG. 27 is a plan view of the semiconductor laser device.

Next, description will be given of a semiconductor laser device of junction-down type according to a fifth embodiment obtained by partially modifying the embodiment described above. FIG. 25 is a cross-sectional view of the semiconductor laser device according to the fifth embodiment. FIG. 26 is a plan view of a submount. FIG. 27 is a plan view of the semiconductor laser device. Note that the same components as those of the embodiment described above are denoted by the same reference numerals and description thereof will be omitted.

In a semiconductor laser device 1D according to the fifth embodiment, as shown in FIGS. 25 to 27, electrode patterns 62Ca, 62Cb and 62Cc are formed in a submount 2D. Specifically, the electrode pattern 62Ca is for aligning a height with the electrode pattern 62Cb and is not connected to the outside. Therefore, the electrode pattern 62Ca may be formed at least only in a region facing a stripe protection part 7. The electrode pattern 62Cb is connected to a stripe protection part 6. Therefore, the electrode pattern 62Cb is formed at least in a region facing the stripe protection part 6. The electrode pattern 62Cc is a pad part connected to the outside. Therefore, the electrode pattern 62Cc may be formed in a part on the submount 2D. Specifically, the electrode pattern 62Cc may have an area that enables connection with a wire for connecting to the outside.

Note that the stress buffer film 64 in the third embodiment may be applied also in the semiconductor laser device 1D according to the fifth embodiment.

Sixth Embodiment

Figure 28:
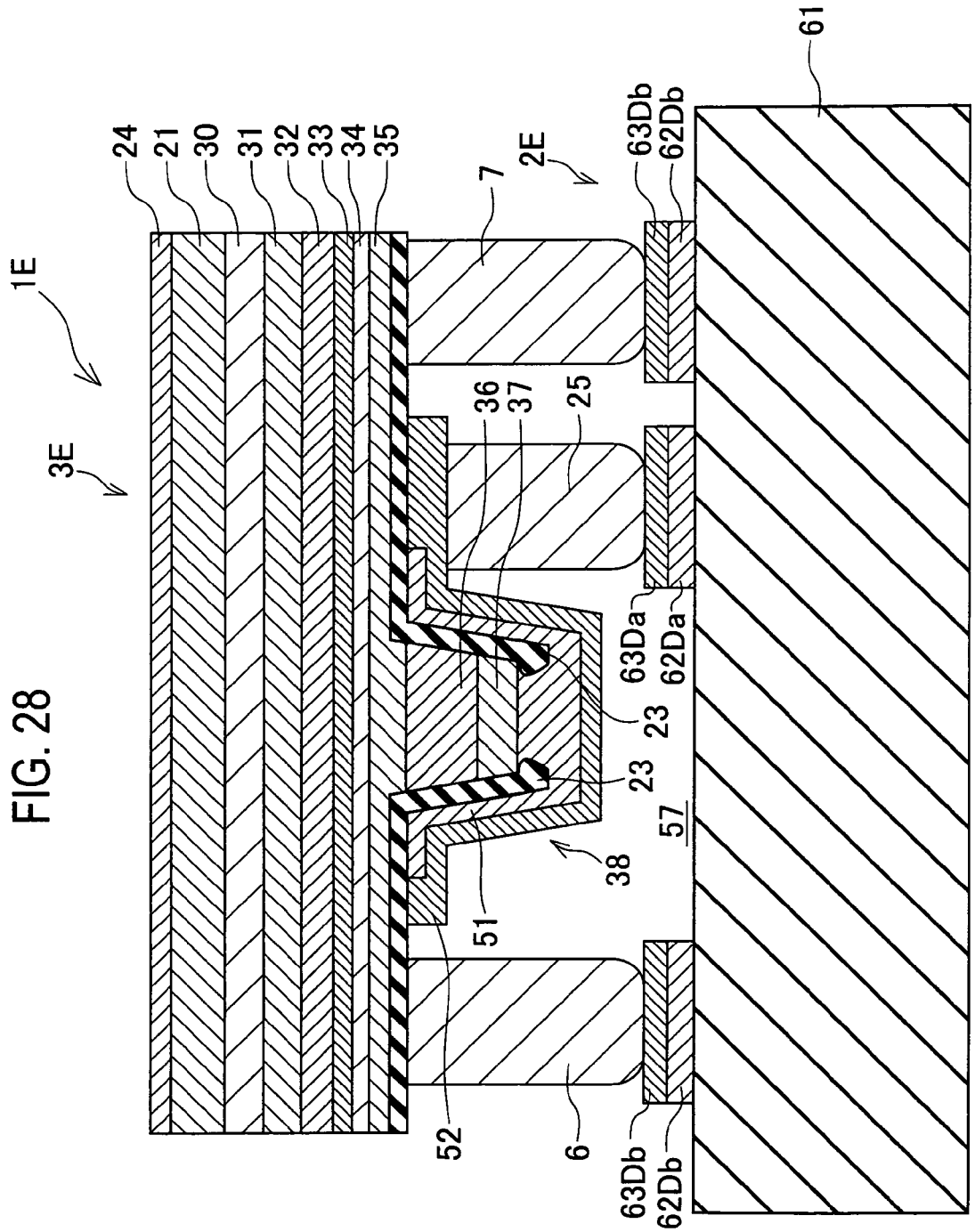
FIG. 28 is a cross-sectional view of a semiconductor laser device according to a sixth embodiment.
Figure 29:
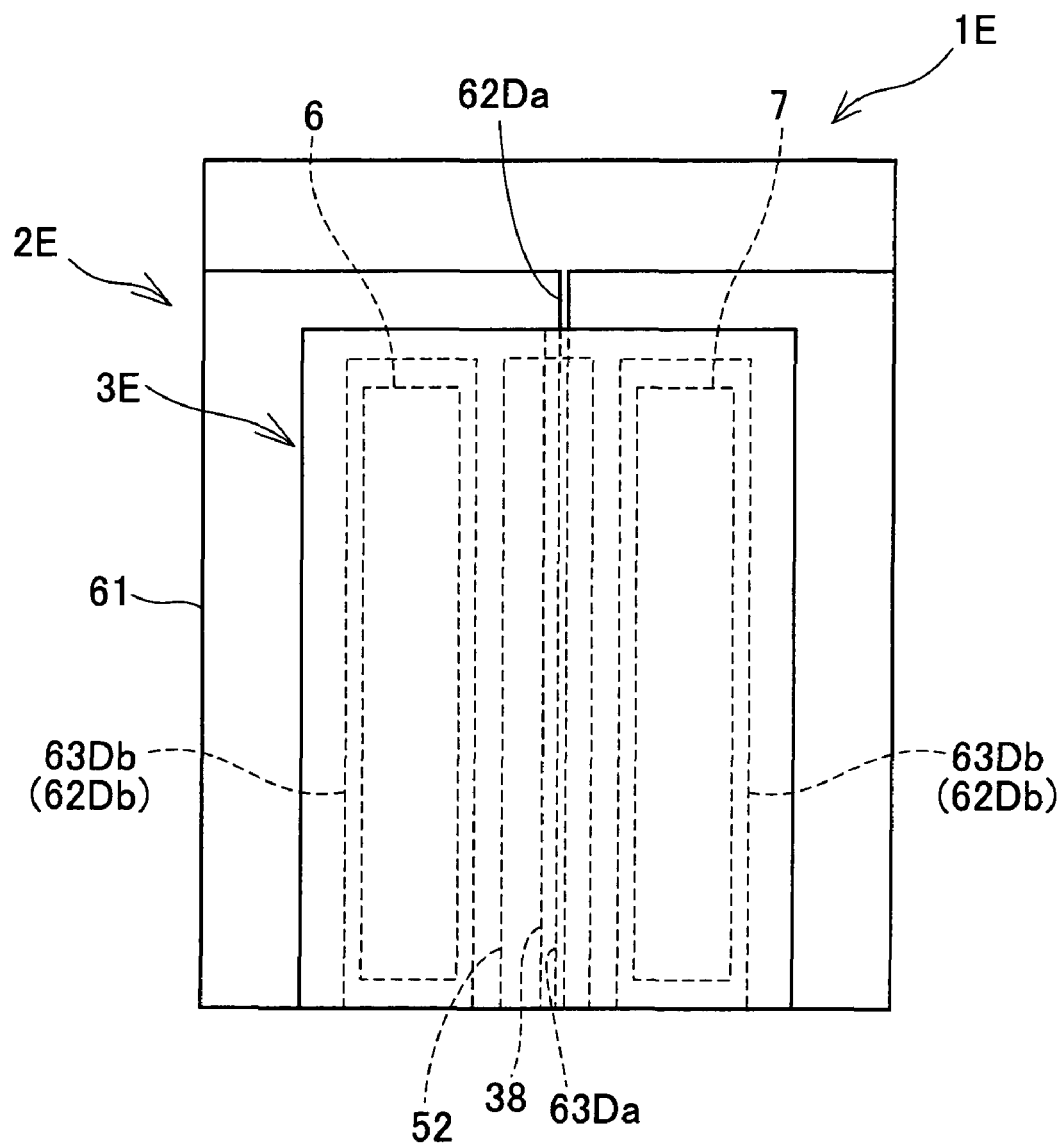
FIG. 29 is a plan view of the semiconductor laser device.

Next, description will be given of a semiconductor laser device of junction-down type according to a sixth embodiment obtained by partially modifying the embodiment described above. FIG. 28 is a cross-sectional view of the semiconductor laser device according to the sixth embodiment. FIG. 29 is a plan view of the semiconductor laser device. Note that the same components as those of the embodiment described above are denoted by the same reference numerals and description thereof will be omitted.

As shown in FIGS. 28 and 29, a semiconductor laser device 1E includes a semiconductor laser element 3E. The semiconductor laser element 3E includes p-side electrode units 25, 51 and 52 and stripe protection parts 6 and 7.

The p-side electrode units 51 and 52 are formed so as to cover a stripe part 38. The p-side electrode units 51 and 52 are formed only in the stripe part 38 and the vicinity thereof. The p-side electrode unit 25 is formed in a part of a region of the p-side electrode unit 52. The p-side electrode unit 25 is not formed in a region facing the stripe part 38. The p-side electrode unit 25 is connected to an electrode pattern 62Da through a solder material layer 63Da.

The stripe protection parts 6 and 7 are formed on an insulating film 23. Specifically, the stripe protection parts 6 and 7 are insulated from the p-side electrode units 25, 51 and 52. The stripe protection parts 6 and 7 are respectively bonded to electrode patterns 62Db with solder material layers 63Db. As described above, the semiconductor laser device 1E according to the sixth embodiment can also achieve the same effects as those achieved by the embodiment described above.

Although the present invention has been described in detail by use of the embodiments, the present invention is not limited to the embodiments described in this specification. The scope of the present invention is determined by description of the scope of claims and scopes equivalent to the description of the scope of claims. Hereinafter, modified embodiments obtained by partially modifying the above embodiments will be described.

For example, the shapes, materials, values and the like used in the above embodiments are illustrative only and can be changed accordingly.

Moreover, in the above embodiments, the description was given of the example of applying the present invention to the semiconductor laser element and the semiconductor laser device. However, the present invention may be applied to another semiconductor light emitting device. For example, the present invention may be applied to a semiconductor optical amplifier (SOA) or the like, in which a pair of reflection preventing films are formed on the end faces instead of the reflective films.

Moreover, in the above embodiments, the description was given by taking the GaN semiconductor as an example. However, a GaAs semiconductor, a Si semiconductor, an InGaP semiconductor and the like may be applied.

Moreover, in the above embodiments, the description was given of the semiconductor light emitting element having the ridge-shaped stripe structure. However, the present invention may be applied to a semiconductor light emitting element having a buried stripe structure.

Moreover, in the above embodiments, the description was given of the example where the present invention is applied to the semiconductor laser element. However, the present invention may be applied to another semiconductor light emitting element such as a light emitting diode.

Moreover, in the above embodiments, the stripe part is formed in the rectangular shape extended in one direction in the planar view. However, the stripe part may be formed in a square shape or any other shapes.

Moreover, in the above embodiments, the description was given of the configuration in which each of the stripe protection parts is divided in the Y direction. However, each of the stripe protection parts may be divided in a matrix pattern. Note that each stripe protection part does not have to be divided.

Moreover, in the above embodiments, the upper surface of the stripe protection part is set higher than the upper surface of the stripe part. However, the upper surface of the stripe protection part may be set at the same height as that of the upper surface of the stripe part.

REFERENCE SIGNS LIST 1, 1A, 1B, 1C, 1D, 1E semiconductor laser device
2, 2A, 2B, 2C, 2E submount
3, 3A, 3E semiconductor laser element
5 p-side electrode
6, 7 stripe protection parts
11 holding substrate
12 electrode unit
12a connection part
12b external terminal part
13, 14 bonding parts
15 bonding pad
21 substrate
22, 22A semiconductor laminate portion
23 insulating film
24 n-side electrode
25 p-side electrode unit
26, 27 bonding parts
28 bonding pad
30 n-type contact layer
31 n-type cladding layer
32 n-type guide layer
33 active layer
34 p-type electron block layer
35 p-type guide layer
35a convex part
36 p-type cladding layer
37 p-type contact layer
38 stripe part
51 first p-side electrode unit
52 second p-side electrode unit
57 space
$6_1$ to $6_6$, $7_1$ to $7_6$ block
61 holding substrate
62, 62A, 62Ba, 62Bb, 62Ca, 62Cb, 62Cc, 62Da, 62Db, 62Dc electrode pattern
63, 63A, 63D solder material layer
64 stress buffer film

The invention claimed is:

1. A semiconductor light emitting element of junction-down type, comprising:
a substrate;
a semiconductor laminate portion which is formed on the substrate and has a stripe part formed therein;
an insulating film formed on the semiconductor laminate portion so as to expose the stripe part; and
a bonding pad having an electrode unit electrically connected to the stripe part exposed from the insulating film and a bonding part formed on the insulating film in a state of being electrically insulated from the electrode unit, wherein
the insulating film is formed on a region, except for at least a portion of the stripe part, among a surface of the semiconductor laminate portion where the stripe part is formed, and the bonding part is disposed only on the insulating film, and a pair of the bonding parts are provided so as to sandwich the electrode unit therebetween.

2. The semiconductor light emitting element of junction-down type according to claim 1, wherein the electrode unit and the bonding parts are made of the same material.

3. The semiconductor light emitting element of junction-down type according to claim 1, wherein the insulating film is exposed between the electrode unit and the bonding parts.

4. The semiconductor light emitting device of junction-down type according to claim 1, wherein a height of the bonding part is higher than a height of the stripe part.

5. The semiconductor light emitting device of junction-down type according to claim 1, wherein a gap exists between the stripe part and the bonding part.

6. A semiconductor light emitting device of junction-down type, comprising:
  a substrate,
  a semiconductor laminate portion which is formed on the substrate and has a stripe part formed therein,
  an insulating film formed on the semiconductor laminate portion so as to expose the stripe part, and
  a first bonding pad having a first electrode unit electrically connected to the stripe part exposed from the insulating film and a first bonding part formed on the insulating film in a state of being electrically insulated from the electrode unit; and
  a submount including
    a holding substrate, and
    a second bonding pad formed on the holding substrate, the second bonding pad having a second electrode unit electrically connected to the first electrode unit, and a second bonding part electrically insulated from the second electrode unit and bonded to the first bonding part, wherein
  the insulating film is formed on a region, except for at least a portion of the stripe part, among a surface of the semiconductor laminate portion where the stripe part is formed, and the first bonding part is disposed only on the insulating film, and
  the back side surface of the surface where the stripe part is formed is provided with a wire bonding part.

7. The semiconductor light emitting device of junction-down type according to claim 6, wherein
  a surface of the first bonding pad contains Au,
  a surface of the second bonding pad contains Au, and
  the first and second bonding pads are bonded by a solder material containing Sn.

8. The semiconductor light emitting device of junction-down type according to claim 6, wherein a height of the first bonding part is higher than a height of the stripe part.

9. The semiconductor light emitting device of junction-down type according to claim 6, wherein a gap exists between the stripe part and the first bonding part.

10. A semiconductor light emitting element of junction-down type, comprising:
  a substrate;
  a semiconductor laminate portion which is formed on the substrate and has a stripe part formed therein;
  an insulating film formed on the semiconductor laminate portion so as to expose the stripe part; and
  a bonding pad having an electrode unit electrically connected to the stripe part exposed from the insulating film and a bonding part formed on the insulating film in a state of being electrically insulated from the electrode unit, wherein
  the insulating film is formed on a region, except for at least a portion of the stripe part, among a surface of the semiconductor laminate portion where the stripe part is formed, and the bonding part is disposed only on the insulating film, and
  the back side surface of the surface where the stripe part is formed is provided with a wire bonding part.

11. The semiconductor light emitting element of junction-down type according to claim 10, wherein a pair of the bonding parts are provided so as to sandwich the electrode unit therebetween.

12. The semiconductor light emitting element of junction-down type according to claim 10, wherein the electrode unit and the bonding parts are made of the same material.

13. The semiconductor light emitting element of junction-down type according to claim 10, wherein the insulating film is exposed between the electrode unit and the bonding parts.

14. The semiconductor light emitting device of junction-down type according to claim 10, wherein a height of the bonding part is higher than a height of the stripe part.

15. The semiconductor light emitting device of junction-down type according to claim 10, wherein a gap exists between the stripe part and the bonding part.

* * * * *